United States Patent
Maeda et al.

(10) Patent No.: US 11,869,788 B2
(45) Date of Patent: Jan. 9, 2024

(54) SUBSTRATE PROCESSING DEVICE

(71) Applicant: EBARA CORPORATION, Tokyo (JP)

(72) Inventors: Koji Maeda, Tokyo (JP); Mitsuhiko Inaba, Tokyo (JP); Haiyang Xu, Tokyo (JP); Tetsuya Yashima, Tokyo (JP)

(73) Assignee: EBARA CORPORATION, Tokyo (JP)

(*) Notice: Subject to any disclaimer, the term of this patent is extended or adjusted under 35 U.S.C. 154(b) by 734 days.

(21) Appl. No.: 16/636,960

(22) PCT Filed: Aug. 9, 2018

(86) PCT No.: PCT/JP2018/029961
§ 371 (c)(1),
(2) Date: Mar. 16, 2020

(87) PCT Pub. No.: WO2019/031590
PCT Pub. Date: Feb. 14, 2019

(65) Prior Publication Data
US 2020/0388510 A1 Dec. 10, 2020

(30) Foreign Application Priority Data
Aug. 10, 2017 (JP) .................................. 2017-155213

(51) Int. Cl.
*H01L 21/67* (2006.01)
*H01L 21/677* (2006.01)
(Continued)

(52) U.S. Cl.
CPC .......... *H01L 21/677* (2013.01); *B08B 15/005* (2013.01); *B24B 37/00* (2013.01); *B24B 37/345* (2013.01); *H01L 21/304* (2013.01)

(58) Field of Classification Search
CPC ..... H01L 21/677; B08B 15/005; B24B 37/00; B24B 37/345
See application file for complete search history.

(56) References Cited

U.S. PATENT DOCUMENTS 7,934,513 B2 * 5/2011 Lim .................. H01L 21/67017
134/84
8,795,032 B2 8/2014 Miyazaki et al.
(Continued)

FOREIGN PATENT DOCUMENTS

CN 1401280 A 3/2003
CN 101114579 A 1/2008
(Continued)

OTHER PUBLICATIONS

International Search Report issued in Patent Application No. PCT/JP2018/029961 dated Oct. 30, 2018.
(Continued)

*Primary Examiner* — Ronald P Jarrett
(74) *Attorney, Agent, or Firm* — PEARNE & GORDON LLP

(57) ABSTRACT

A substrate processing apparatus includes a first processing unit and a second processing unit placed in upper and lower two stages. Each processing unit has: a plurality of processing tanks arranged in series; a partition wall defining a conveyance space extending along an arrangement direction outside the plurality of processing tanks; a conveyance mechanism placed in the conveyance space and being configured to convey a substrate between the processing tanks along the arrangement direction; and an air guide duct provided to extend along the arrangement direction in the conveyance space. The air guide duct is connected with a fan filter unit. Each of the processing tanks is connected with an exhaust duct. An opening is formed in each of parts facing the processing tank in the air guide duct. The conveyance spaces of the first and second processing units are separated into upper and lower segments by the partition wall.

36 Claims, 13 Drawing Sheets

(51) Int. Cl.
*B24B 37/00* (2012.01)
*H01L 21/304* (2006.01)
*B08B 15/00* (2006.01)
*B24B 37/34* (2012.01)

(56) References Cited

U.S. PATENT DOCUMENTS

| | | |
|---|---|---|
| 10,889,438 B2* | 1/2021 | Kusama ............ H01L 21/67775 |
| 2004/0261944 A1 | 12/2004 | Wakabayashi et al. |
| 2008/0023049 A1 | 1/2008 | Matsumoto et al. |
| 2008/0035181 A1 | 2/2008 | Takahashi |
| 2009/0067959 A1 | 3/2009 | Takahashi et al. |
| 2012/0227768 A1* | 9/2012 | Morita ............... H01L 21/67028 |
| | | 134/18 |
| 2015/0357213 A1* | 12/2015 | Yokoyama ........ H01L 21/67751 |
| | | 134/32 |
| 2018/0001440 A1 | 1/2018 | Aono et al. |

FOREIGN PATENT DOCUMENTS

| | | |
|---|---|---|
| CN | 205156576 U | 4/2016 |
| CN | 205481036 U | 8/2016 |
| JP | H06-163505 A | 6/1994 |
| JP | H10-284457 A | 10/1998 |
| JP | H11-314703 A | 11/1999 |
| JP | H11-330038 A | 11/1999 |
| JP | H11-345858 A | 12/1999 |
| JP | 2003-309089 A | 10/2003 |
| JP | 2008-042099 A | 2/2008 |
| JP | 2010-050436 A | 3/2010 |
| JP | 2012-190823 A | 10/2012 |
| JP | 2013-089689 A | 5/2013 |
| WO | 2007-099976 A1 | 9/2007 |
| WO | 2017-094406 A1 | 6/2017 |

OTHER PUBLICATIONS

Written Opinion issued in Patent Application No. PCT/JP2018/029961 dated Oct. 30, 2018.

* cited by examiner

SUBSTRATE PROCESSING DEVICE

TECHNICAL FIELD

The present invention relates to a substrate processing apparatus, and particularly to a substrate processing apparatus used for polishing and flattening a substrate such as a semiconductor wafer.

BACKGROUND

In recent years, as the packaging density of a semiconductor device increases, wires in a circuit are becoming finer and a wire-to-wire distance is becoming smaller. In manufacture of such a semiconductor device, many kinds of materials are repeatedly formed each in a film form on a silicon wafer, to form a layered structure. For formation of this layered structure, a technique of flattening a surface of the wafer plays a significant role. As a means to flatten a surface of a wafer, a polishing apparatus that performs chemical mechanical polishing (CMP) (also referred to as a chemical mechanical polishing apparatus) is widely used.

The chemical mechanical polishing (CMP) apparatus typically includes a polishing table provided with a polishing pad, a top ring that holds a wafer, and a nozzle that supplies polishing liquid onto the polishing pad. While polishing liquid is supplied onto the polishing pad from the nozzle, the wafer is pressed against the polishing pad by the top ring. Then, the top ring and the polishing pad are relatively moved, thereby polishing the wafer and flattening the surface thereof.

The substrate processing apparatus is an apparatus that has a function of cleaning and drying the polished wafer, in addition to a function as the above-described CMP apparatus. JP 2010-50436 A suggests a cleaning unit that has a plurality of cleaning lines arranged in parallel and a conveyance robot that allocates a wafer to any of the plurality of cleaning lines arranged in parallel, to achieve high throughput. In this cleaning unit, a plurality of cleaning chambers and a plurality of conveyance chambers are alternately placed. In each cleaning chamber, a plurality of cleaning tanks are arranged along a vertical direction, and in each conveyance chamber, a conveyance robot moves upward and downward to get access to the plurality of cleaning tanks.

SUMMARY

In the meantime, in a cleaning unit of a substrate processing apparatus, dust generated from a conveyance mechanism for conveying a wafer may probably form a defect source. For this reason, the conventional cleaning unit is provided with a fan filter unit (FFU) above each conveyance chamber, which enables airstream design in which downflow from the FFU is exhausted from each of cleaning tanks of an adjacent cleaning chamber.

However, in such a cleaning unit, due to upward/downward movement of a conveyance robot between a plurality of cleaning lines arranged in parallel, a difference in airstream between the cleaning lines is caused. This may probably cause a process difference because a defect source in one cleaning line can be less satisfactorily discharged than that in another cleaning line.

It is an object of the present invention to provide a substrate processing apparatus that can reduce defects of a wafer while achieving high throughput.

A substrate processing apparatus according to the present invention includes
 a first processing unit and a second processing unit placed in upper and lower two stages, wherein
 each of the first processing unit and the second processing unit has:
 a plurality of processing tanks arranged in series;
 a partition wall defining a conveyance space extending along an arrangement direction outside the plurality of processing tanks;
 a conveyance mechanism that is placed in the conveyance space and is configured to convey a substrate between the processing tanks along the arrangement direction; and
 an air guide duct provided so as to extend along the arrangement direction in the conveyance space,
 the air guide duct is connected with a fan filter unit,
 each of the processing tanks is connected with an exhaust duct,
 an opening is formed in each of parts facing the processing tank in the air guide duct, and
 the conveyance space of the first processing unit and the conveyance space of the second processing unit are separated into upper and lower segments by the partition wall.

According to the present invention, the first processing unit and the second processing unit placed in upper and lower two stages can process a plurality of substrates in parallel, thereby achieving high throughput. Further, the air guide duct is provided so as to extend along the arrangement direction of the plurality of processing tanks in the conveyance space of each of the processing units, and the opening is formed in each of parts facing the processing tank. Hence, airstream can orderly flow through the conveyance space without being blocked or stagnated by the conveyance mechanism, which prevents dust generated from the conveyance mechanism from forming a defect source. Further, the conveyance space of the first cleaning unit and the conveyance space of the second cleaning unit are separated into upper and lower segments by the partition wall, which prevents a difference in airstream between the first processing unit and the second processing unit from being caused. Combining organically such effects as described above can effectively reduce defects of a wafer in each of the first processing unit and the second processing unit.

In the substrate processing apparatus according to the present invention,
 the air guide duct may be placed above the plurality of processing tanks.

According to this aspect, airstream blown out from the openings of the air guide duct flows downward along the front surface and the side surfaces of each of the processing tanks in the conveyance space, which can prevent dust floating in the conveyance space from being flown up by the airstream.

In the substrate processing apparatus according to the present invention,
 the conveyance mechanism may have:
 a pair of arms configured to be opened and closed and grasp the substrate;
 an upward/downward movement mechanism configured to move the pair of arms upward and downward;
 a turn mechanism configured to turn the pair of arms about a rotation axis parallel to a direction in which the pair of arms is opened or closed; and an arrangement-direction movement mechanism configured to move the pair of arms linearly along the arrangement direction, the arrangement-direction movement mechanism may be covered with a cover extending along the arrangement direction, and the cover may be connected with a second exhaust duct.

According to this aspect, a part of airstream blown out from the openings of the air guide duct enters to the inside of the cover and is exhausted from the second exhaust duct. This can effectively prevent dust generated from the arrangement-direction movement mechanism from being scattered in the conveyance space.

In the substrate processing apparatus according to the present invention, the arrangement-direction movement mechanism may be placed above the plurality of processing tanks, and a set formed of the pair of arms, the upward/downward movement mechanism, and the turn mechanism may be placed below the arrangement-direction movement mechanism so as to hang.

In the substrate processing apparatus according to the present invention, the air guide duct may be placed between the plurality of processing tanks and the arrangement-direction movement mechanism.

In the substrate processing apparatus according to the present invention, the fan filter unit may be connected with one end of the air guide duct, and a plurality of the openings located closer to the one end may be formed so as to be smaller.

According to those aspects, a flow rate of airstream blown out from the openings located far from the fan filter unit can be relatively increased, which allows sufficient airstream to be blown out from each of the openings.

In the substrate processing apparatus according to the present invention, along the arrangement direction, a center of the opening may be aligned to a position closer to the one end than a center in its corresponding processing tank.

According to this aspect, airstream blown out from the openings can be allowed to sufficiently flow along not only the front surface and the downstream side surface, but also the upstream side surface, of each of the processing tanks, in the conveyance space.

In the substrate processing apparatus according to the present invention, the processing tank may be a cleaning module.

A substrate processing apparatus according to the present invention includes:

a plurality of processing tanks arranged in series; a partition wall defining a conveyance space extending along an arrangement direction outside the plurality of processing tanks;

a conveyance mechanism that is placed in the conveyance space and is configured to convey a substrate between the processing tanks along the arrangement direction; and an air guide duct provided so as to extend along the arrangement direction in the conveyance space, wherein the air guide duct is connected with a fan filter unit, each of the processing tanks is connected with an exhaust duct, and an opening is formed in each of parts facing the processing tank in the air guide duct.

DESCRIPTION OF EMBODIMENTS

Below, an embodiment of the present invention will be described with reference to the drawings. In the following description and the drawings referred to in the following description, components that can be formed so as to be the same with each other will be denoted by the same reference signs and duplicated description thereof will be omitted.

<Configuration of Substrate Processing Apparatus>

Figure 1:
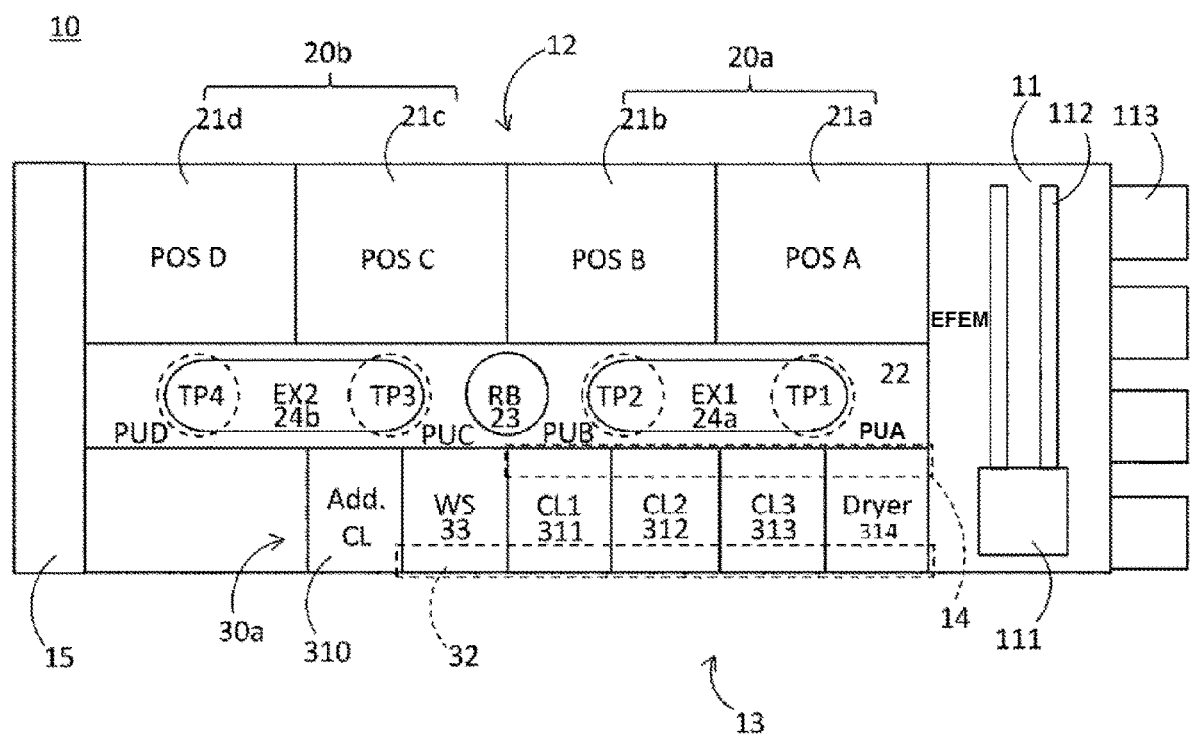
FIG. 1 is a plan view illustrating an overall configuration of a substrate processing apparatus according to an embodiment.

FIG. 1 is a plan view illustrating an overall configuration of a substrate processing apparatus according to an embodiment. As illustrated in FIG. 1, a substrate processing apparatus 10 includes a housing that has a substantially rectangular shape when seen from above. The inside of the housing is partitioned into a loading/unloading section 11, a polishing section 12, a cleaning section 13, and a conveyance section 14 by partition walls. Each of the loading/unloading section 11, the polishing section 12, the cleaning section 13, and the conveyance section 14 is independently assembled and is independently exhausted. Further, the substrate processing apparatus 10 is provided with a control section 15 (also referred to as a control board) that controls operations of the loading/unloading section 11, the polishing section 12, the cleaning section 13, and the conveyance section 14.

The loading/unloading section 11 includes a plurality of (four in an example illustrated in the drawings) front loading units 113 on each of which a wafer cassette having a stock of many wafers (substrates) W is mounted. The front loading units 113 are arranged adjacently to each other along a width direction (a direction perpendicular to a lengthwise direction) of the substrate processing apparatus 10. On the front loading units 113, an open cassette, a standard manufacturing interface (SMIF) pod, or a front opening unified pod (FOUP) can be mounted. In this regard, a SMIF or a FOUP is an enclosed vessel that stores therein a wafer cassette and is covered with partition walls, thereby keeping the inside thereof in an environment independent of an outside space.

Further, in the loading/unloading section 11, a travel mechanism 112 is laid along an arrangement direction of the front loading units 113. On the travel mechanism 112, a conveyance robot 111 movable along the arrangement direction of the front loading units 113 is provided. The conveyance robot 111 is so designed as to get access to a wafer cassette mounted on the front loading unit 113 by moving on the travel mechanism 112.

The conveyance section 14 is an area where a wafer that is yet to be polished is conveyed from the loading/unloading section 11 to the polishing section 12, and the conveyance section 14 is provided so as to extend along the lengthwise direction of the substrate processing apparatus 10. In the present embodiment, the conveyance section 14 has a slide stage (not illustrated) that holds a wafer W and a stage movement mechanism (not illustrated) that moves the slide stage linearly along the lengthwise direction.

In an outer surface of the slide stage, four pins are provided so as to protrude upward. The wafer W to be put on the slide stage by the conveyance robot 111 of the loading/unloading section 11 is positioned with an outer edge thereof being guided by the four pins, and then is supported on the slide stage. Those pins are formed of resin such as polypropylene (PP), polychlorotrifluoroethylene (PCTFE), or polyetherether ketone (PEEK).

As the stage movement mechanism, either a motor drive mechanism using a ball screw or an air cylinder is used, for example. Using a rod-less cylinder as the stage movement mechanism is preferable in that it can prevent dust generation from a sliding unit. The slide stage is fixed to a movable part of the stage movement mechanism and is moved linearly along the lengthwise direction by power given from the stage movement mechanism.

The polishing section 12 is an area where the wafer W is polished, and the polishing section 12 has a first polishing unit 20a having a first polishing device 21a and a second polishing device 21b, a second polishing unit 20b having a third polishing device 21c and a fourth polishing device 21d, and a polishing-section conveyance mechanism 22 placed adjacently to each of the conveyance section 14, the first polishing unit 20a, and the second polishing unit 20b. Along the width direction of the substrate processing apparatus 10, the conveyance section 14 is placed between the conveyance section 14 and the first polishing unit 20a or the second polishing unit 20b.

The first polishing device 21a, the second polishing device 21b, the third polishing device 21c, and the fourth polishing device 21d are arranged along the lengthwise direction of the substrate processing apparatus 10. Each of the first polishing device 21a, the second polishing device 21b, the third polishing device 21c, and the fourth polishing device 21d has a polishing table (not illustrated) to which a polishing pad having a polishing surface is attached, a top ring (not illustrated) for holding and polishing the wafer W while pressing the wafer W against the polishing pad on the polishing table, a polishing-liquid supply nozzle (not illustrated) for supplying polishing liquid (also referred to as slurry) or dressing liquid (pure water, for example) to the polishing pad, a dresser (not illustrated) for dressing the polishing surface of the polishing pad, and an atomizer (not illustrated) that atomizes a gas mixture of liquid (pure water, for example) and gas (nitrogen gas, for example), or liquid (pure water, for example), and sprays it onto the polishing surface.

The top ring of the first polishing device 21a, in response to a swinging operation of a top-ring head, moves between a polishing position and a first substrate conveyance position TP1. In the first substrate conveyance position TP1, a wafer is transferred to the first polishing device 21a. Similarly, the top ring of the second polishing device 21b, in response to a swinging operation of a top-ring head, moves between a polishing position and a second substrate conveyance position TP2. In the second substrate conveyance position TP2, a wafer is transferred to the second polishing device 21b. The top ring of the third polishing device 21c, in response to a swinging operation of a top-ring head, moves between a polishing position and a third substrate conveyance position TP3. In the third substrate conveyance position TP3, a wafer is transferred to the third polishing device 21c. The top ring of the fourth polishing device 21d, in response to a swinging operation of a top-ring head, moves between a polishing position and a fourth substrate conveyance position TP4. In the fourth substrate conveyance position TP4, a wafer is transferred to the fourth polishing device 21d.

The polishing-section conveyance mechanism 22 has a first conveying unit 24a that conveys the wafer W to the first polishing unit 20a, a second conveying unit 24b that conveys the wafer W to the second polishing unit 20b, and a conveyance robot 23 that is placed between the first conveying unit 24a and the second conveying unit 24b and transfers a wafer from the conveyance section 14 to the first conveying unit 24a and the second conveying unit 24b. In the example illustrated in the drawings, the conveyance robot 23 is placed in the approximate center of the housing of the substrate processing apparatus 10. The wafers W, which are successively conveyed from the conveyance section 14 to the polishing section 12, are allocated to the first conveying unit 24a and the second conveying unit 24b by the conveyance robot 23.

A wafer transferred to the first conveying unit 24a is conveyed to and polished by the first polishing device 21a or the second polishing device 21b. Then, the wafer polished by the first polishing device 21a or the second polishing device 21b is returned to the conveyance robot 23 via the first conveying unit 24a. Similarly, a wafer transferred to the second conveying unit 24b is conveyed to and polished by the third polishing device 21c or the fourth polishing device 21d. Then, the wafer polished by the third polishing device 21c or the fourth polishing device 21d is returned to the conveyance robot 23 via the second conveying unit 24b. The conveyance robot 23 conveys the wafer received from the first conveying unit 24a or the second conveying unit 24b to the cleaning section 13.

<Configuration of Cleaning Section>

Figure 2A:
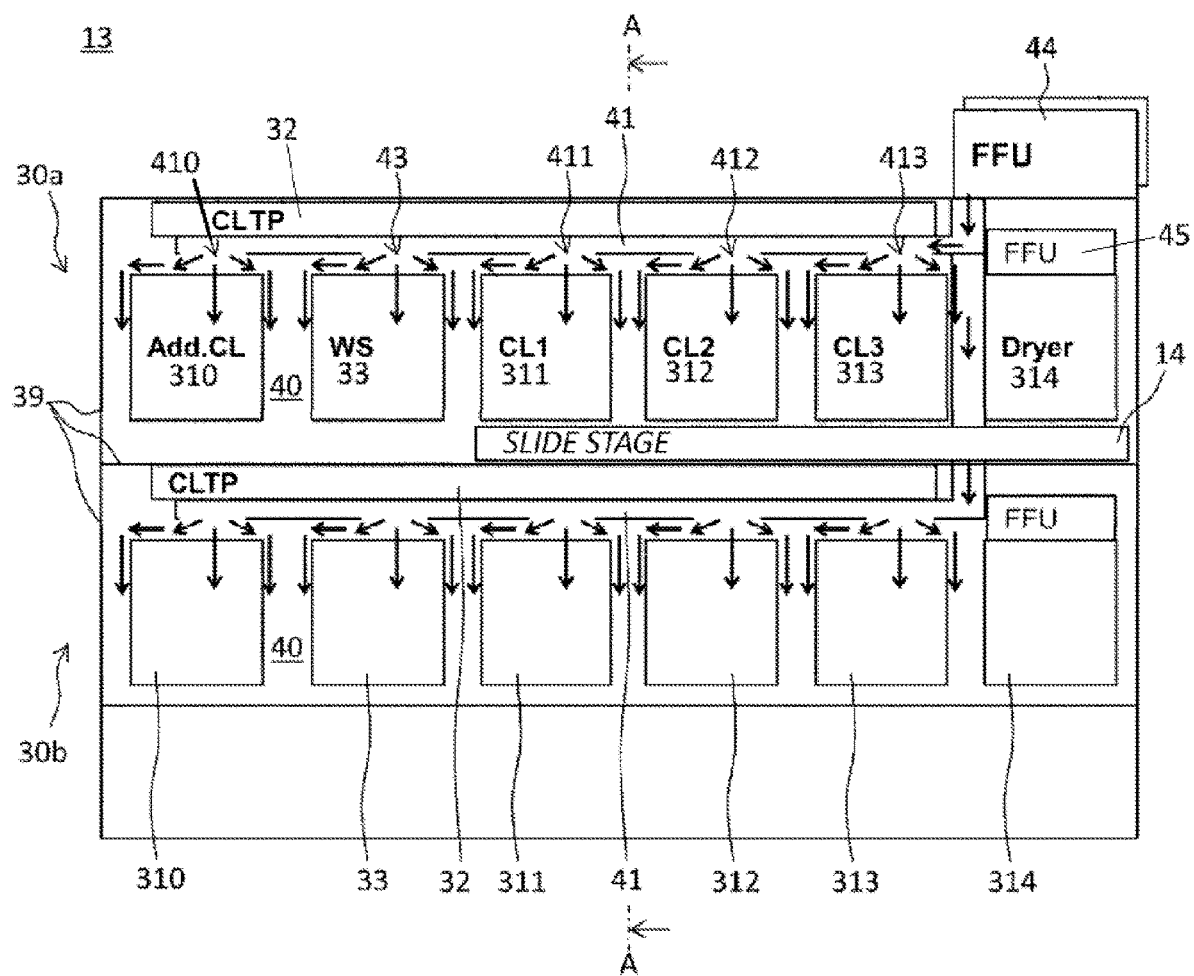
FIG. 2A is a front view schematically illustrating a configuration of a cleaning section of the substrate processing apparatus illustrated in FIG. 1.
Figure 2B:
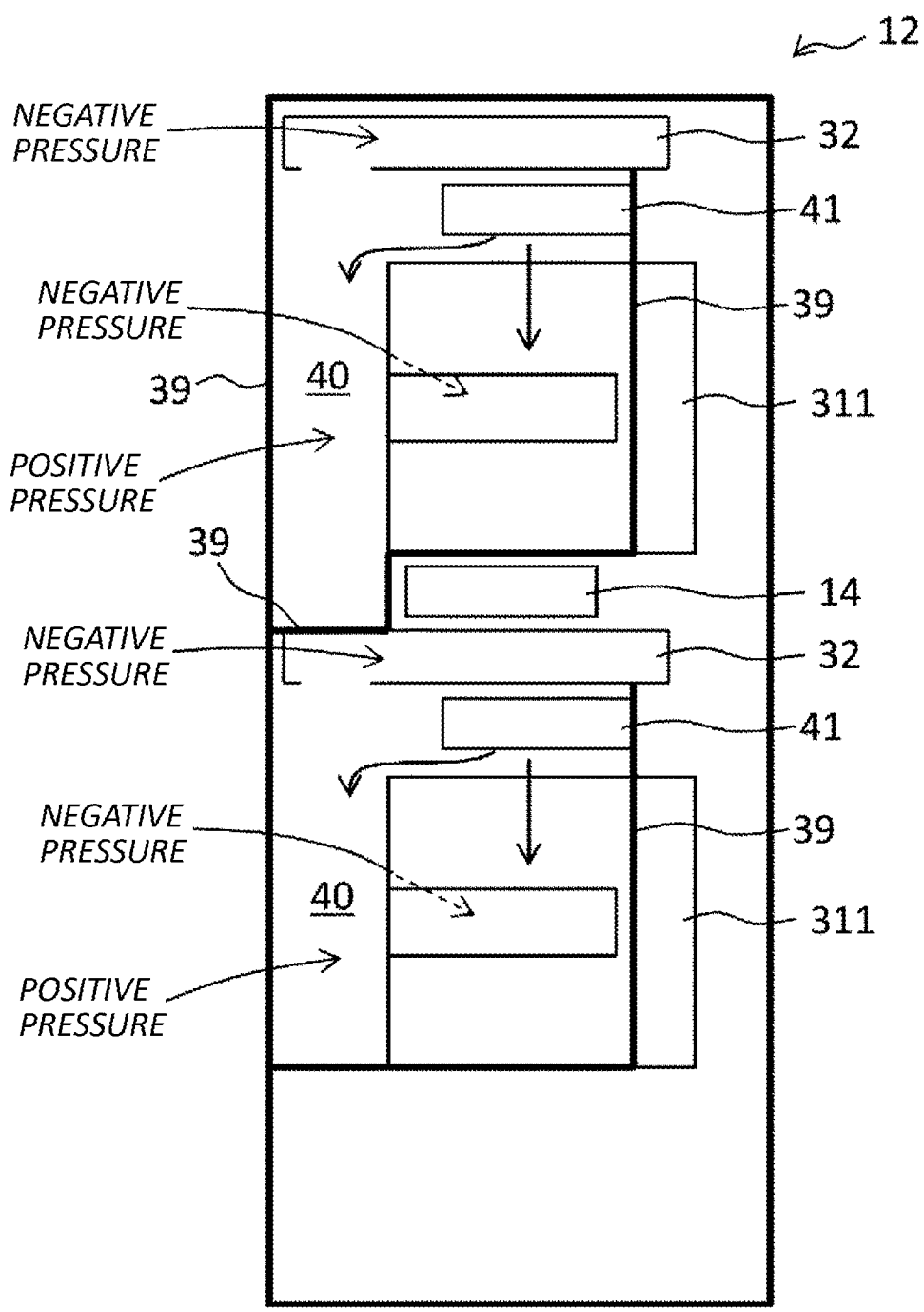
FIG. 2B is a view illustrating a cross section of the cleaning section illustrated in FIG. 2A, taken along a line A-A.

FIG. 2A is a side view schematically illustrating a configuration of the cleaning section 13 of the substrate processing apparatus 10 illustrated in FIG. 1. FIG. 2B is a view illustrating a cross section of the cleaning section illustrated in FIG. 2A, taken along a line A-A.

As illustrated in FIGS. 2A and 2B, the cleaning section 13 is an area where a polished wafer is cleaned, and the cleaning section 13 has a first processing unit 30a and a second processing unit 30b placed in upper and lower two stages. The above-described conveyance section 14 is placed between the first processing unit 30a and the second processing unit 30b. The first processing unit 30a, the conveyance section 14, and the second processing unit 30b are arranged so as to be vertically stacked, which produces an advantage of a small footprint.

The configuration of the second processing unit 30b is the same as the configuration of the first processing unit 30a, and thus the configuration of the first processing unit 30a will be representatively described below.

As illustrated in FIG. 2A, the first processing unit 30a has a plurality of (five in the example illustrated in the drawings) processing tanks 310, 33, and 311 to 314 arranged in series, partition walls 39 that define conveyance spaces 40 each extending along an arrangement direction of the tanks (horizontal direction in FIG. 2A) outside the plurality of processing tanks 310, 33, and 311 to 314, and a conveyance mechanism 32 that is placed in the conveyance space 40 and conveys the wafer W between the processing tanks 310, 33, and 311 to 314 along the arrangement direction.

Hereinafter, occasionally, the processing tank denoted by the reference sign 310 will be referred to as an auxiliary cleaning module, the processing tank denoted by the reference sign 33 will be referred to as a wafer station, and the processing tanks denoted by the reference signs 311 to 314 will be referred to as first to fourth cleaning modules, respectively. The auxiliary cleaning module 310, the wafer station 33, and the first to fourth cleaning modules 311 to 314 are sequentially arranged in a line along the arrangement direction (horizontal direction in FIG. 2A) in the order in which those are mentioned.

Figure 3:
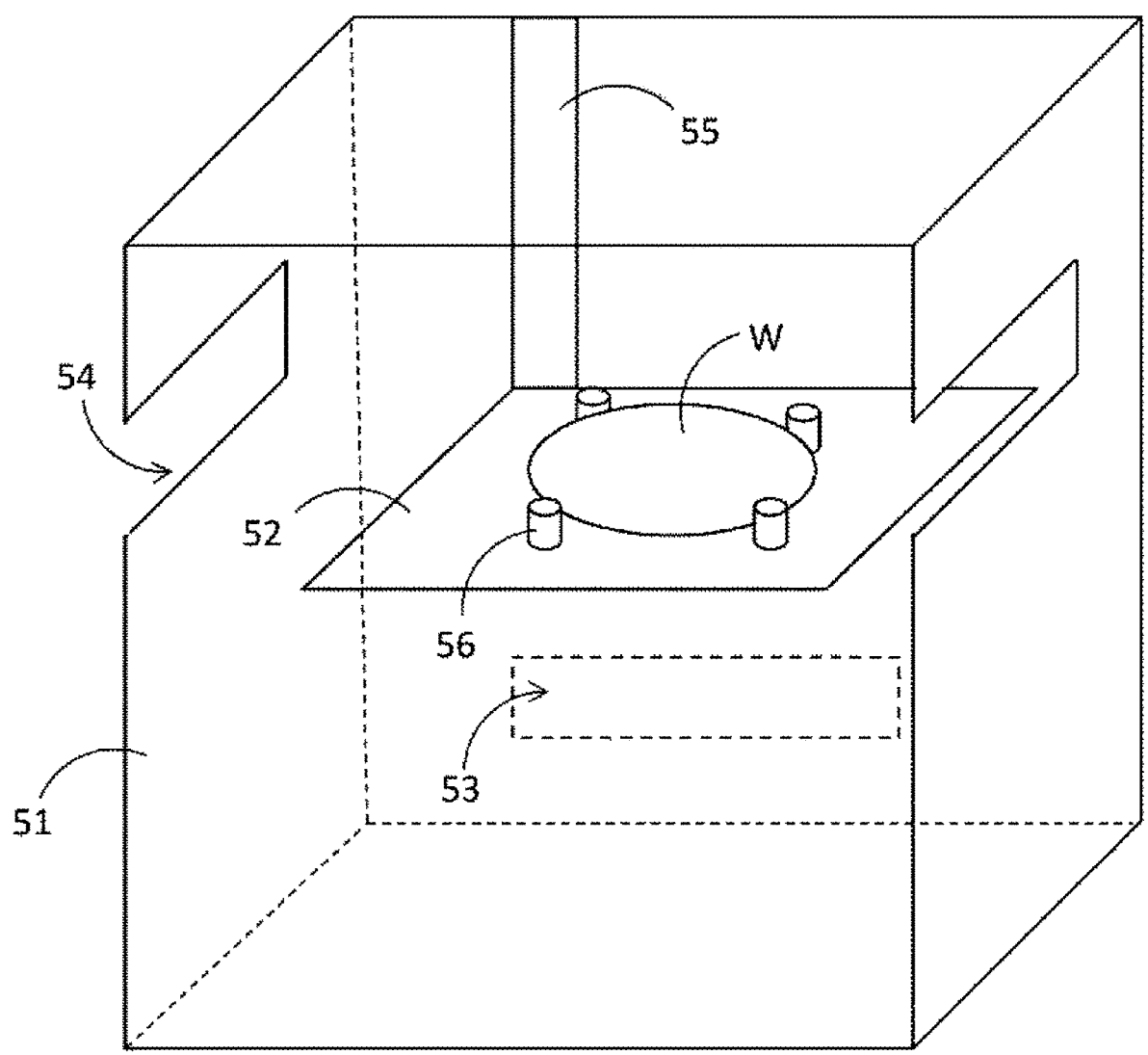
FIG. 3 is an exploded perspective view schematically illustrating a wafer station of the cleaning section illustrated in FIG. 2A.

FIG. 3 is an exploded perspective view schematically illustrating a configuration of the wafer station 33.

As illustrated in FIG. 3, the wafer station 33 has a casing 51 having a shape of an approximate rectangular parallelepiped, a stage 52 that is placed in the casing 51 and holds the wafer W, and a drive mechanism 55 that moves the stage 52 upward and downward.

The casing 51 has a bottom plate, four side plates, and a top plate. As illustrated in FIG. 3, in a side plate facing the polishing section 12 (a side plate illustrated as it is on the deepest side in FIG. 3) among the four side plates, a loading slot 53 communicating with the polishing section 12 is formed in a lower end. The loading slot 53 can be opened and closed by a shutter not illustrated. The conveyance robot 23 of the polishing section 12 can make access to the inside of the casing 51 through the loading slot 53.

Further, as illustrated in FIG. 3, in each of the other three side plates (i.e., a side plate facing the conveyance mechanism 32 described later, and side plates on right and left sides) among the four side plates, an arm passage opening 54 for allowing an arm of the conveyance mechanism 32 to pass therethrough is formed in a position at a height different from that of the loading slot 53. The arm passage opening 54 can be opened and closed by a shutter not illustrated. The conveyance mechanism 32 can make access to the inside of the casing 51 through the arm passage opening 54.

As the drive mechanism 55, either a motor drive mechanism using a ball screw or an air cylinder is used, for example. The stage 52 is fixed to a movable part of the drive mechanism 55 and is moved upward and downward between a position at a height where the stage 52 faces the loading slot 53 and a position at a height where the stage 52 faces the arm passage opening 54, by power given from the drive mechanism 55.

In an outer surface of the stage 52, four pins 56 are provided so as to protrude upward. The wafer W to be put on the stage 52 is positioned with an outer edge thereof being guided by the four pins 56, and then is supported on the stage 52. Those pins 56 are formed of resin such as polypropylene (PP), polychlorotrifluoroethylene (PCTFE), or polyetherether ketone (PEEK).

Each of the auxiliary cleaning module 310 and the first to fourth cleaning modules 311 to 314 has a cleaner not illustrated and a casing 91 (refer to FIGS. 7 and 8) covering the cleaner.

As the cleaner of each of the first cleaning module 311 and the second cleaning module 312, a roll-type cleaner that presses upper and lower rolled sponges against a front surface and a rear surface of a wafer while rotating the rolled sponges to clean the front surface and the rear surface of the wafer can be used, for example. As the cleaner of the third cleaning module 313, a pencil-type cleaner that presses a hemispheric sponge against a wafer while rotating the sponge to clean can be used, for example. As the cleaner of the fourth cleaning module 314, a pencil-type cleaner that can rinse a rear surface of a wafer and presses a hemispheric sponge against a front surface of the wafer while rotating the sponge to clean the front surface of the wafer can be used, for example. This cleaner of the fourth cleaning module 314 includes a stage on which a chucked wafer is rotated at a high speed, and thus has a function of drying a cleaned wafer by rotating the wafer at a high speed (spin dry function). Additionally, for the cleaner of each of the cleaning modules 311 to 314, a megasonic-type cleaner that applies ultrasonic waves to cleaning liquid to clean may be supplementarily provided in addition to the above-described roll-type cleaner or pencil-type cleaner. In the example illustrated in the drawings, the fourth cleaning module 314 is provided with an individual fan filter unit 45, thereby producing high cleanliness in the inside.

Figure 7:
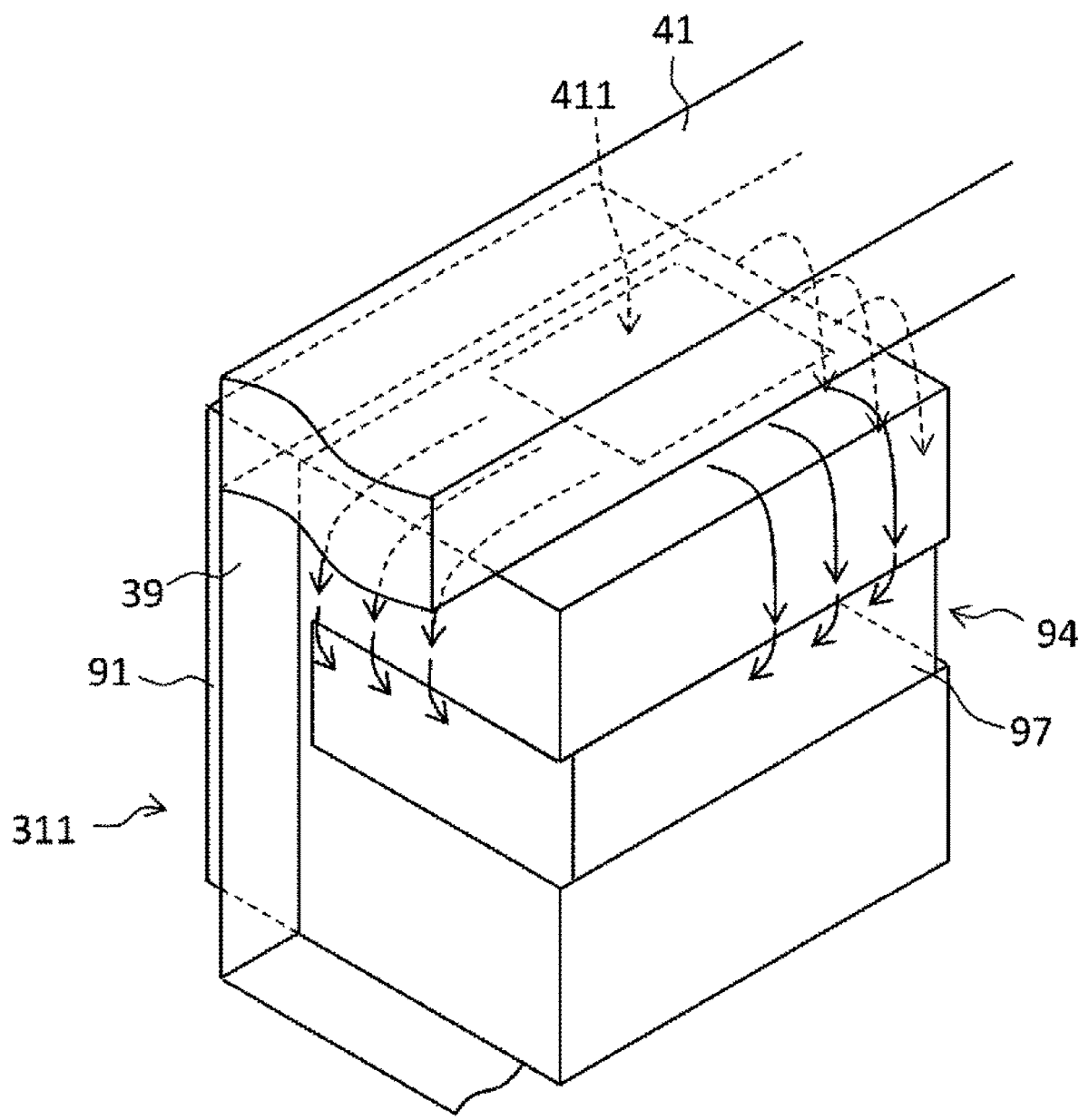
FIG. 7 is a perspective view for explaining a positional relationship between an air guide duct and a processing tank.
Figure 8:
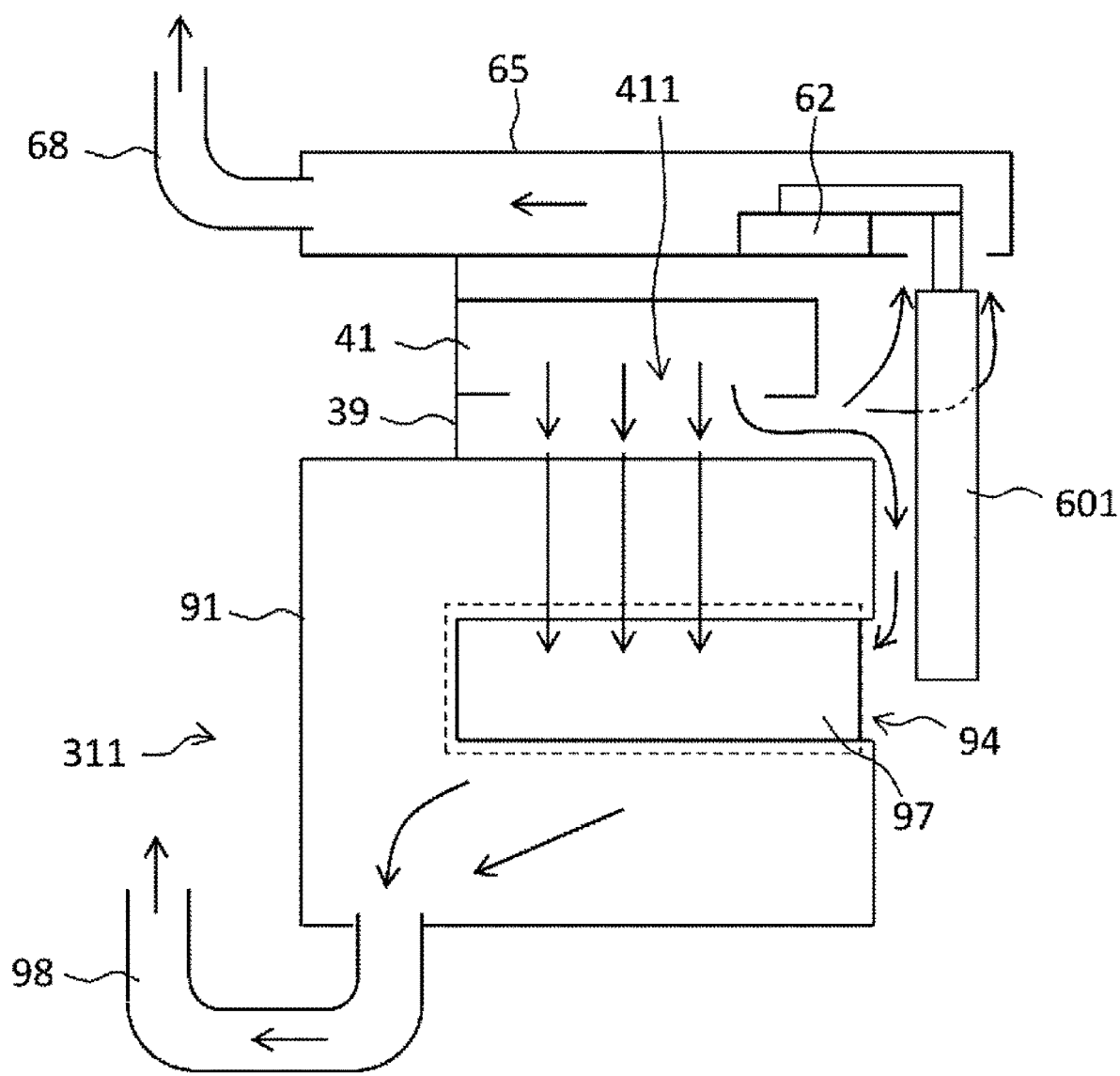
FIG. 8 is a side view for explaining a positional relationship among the air guide duct, the processing tank, and the conveyance mechanism.

The casing 91 covering the cleaner, like the casing 51 of the wafer station 33, has a bottom plate, four side plates, and a top plate (refer to FIGS. 7 and 8). In each of the other three side plates (i.e., a side plate facing the conveyance mechanism 32 described later, and side plates on right and left sides) among the four side plates, an arm passage opening 94 for allowing an arm of the conveyance mechanism 32 to pass therethrough is formed. The arm passage opening 94 can be opened and closed by a shutter 95. The conveyance mechanism 32 can make access to the inside of the casing 91 through the arm passage opening 94.

Figure 4:
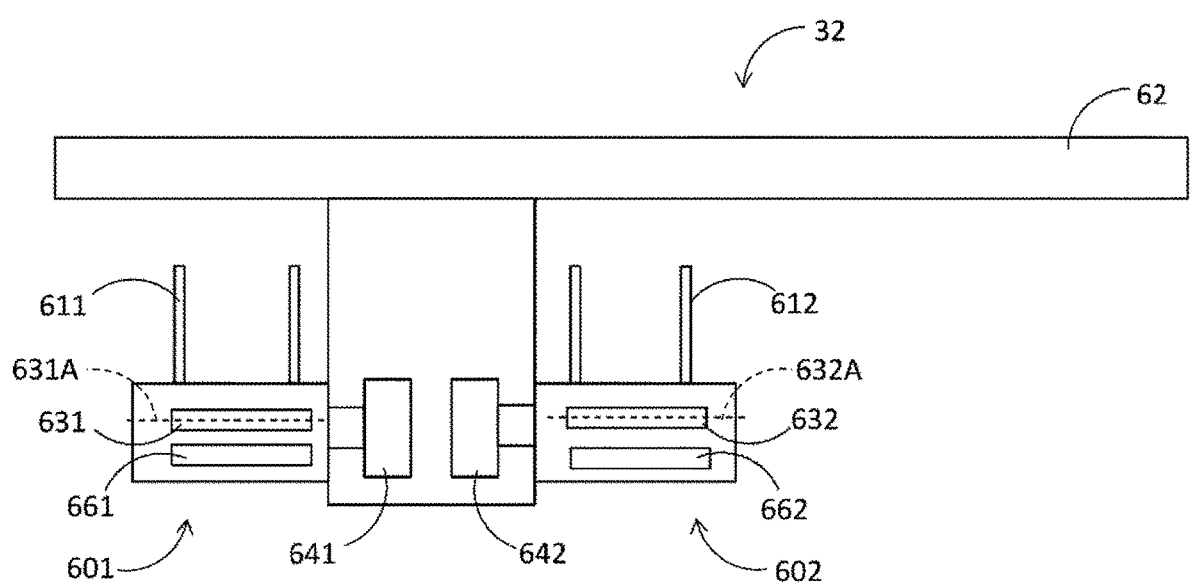
FIG. 4 is a front view schematically illustrating a configuration of a conveyance mechanism of the cleaning section illustrated in FIG. 2A.

FIG. 4 is a front view schematically illustrating a configuration of the conveyance mechanism 32.

As illustrated in FIG. 4, the conveyance mechanism 32 has a first wafer grasp mechanism 601 and a second wafer grasp mechanism 602 each of which grasps the wafer W, and an arrangement-direction movement mechanism 62 that moves the first wafer grasp mechanism 601 and the second wafer grasp mechanism 602 linearly along the arrangement direction of the plurality of processing tanks 310, 33, and 311 to 314. In the present embodiment, the number of the wafer grasp mechanisms 601 and 602 is smaller than the number of the plurality of processing tanks 310, 33, and 311 to 314.

In the present embodiment, the first wafer grasp mechanism 601 and the second wafer grasp mechanism 602 can be used selectively depending on the cleanliness of the wafer W, for example. For example, among the first to fourth cleaning modules 311 to 314, the first cleaning module 311 and the second cleaning module 312 responsible for the first half of a cleaning process use the first wafer grasp mechanism 601 and the third cleaning module 313*a* and the fourth cleaning module 314 responsible for the latter half of the cleaning process use the second wafer grasp mechanism 602. This can prevent the wafer W being subjected to the latter half of the cleaning process from being contaminated due to contact with the first wafer grasp mechanism 601.

More specifically, the first wafer grasp mechanism 601 has a pair of first arms 611 that grasps a wafer and can be opened and closed, a first upward/downward movement mechanism 641 that moves the pair of first arms 611 upward and downward, a first turn mechanism. 631 that turns the pair of first arms 611 about a rotation axis 631A parallel to a direction in which the pair of first arms 611 is opened or closed, and a first open/close mechanism 661 that opens and closes the pair of first arms 611 in a direction in which the arms are brought close to each other or are separated from each other.

Similarly, the second wafer grasp mechanism 602 has a pair of second arms 612 that grasps a wafer and can be opened and closed, a second upward/downward movement mechanism 642 that moves the pair of second arms 612 upward and downward, a second turn mechanism 632 that turns the pair of second arms 612 about a rotation axis 632A parallel to a direction in which the pair of second arms 612 is opened or closed, and a second open/close mechanism 662 that opens and closes the pair of second arms 612 in a direction in which the arms are brought close to each other or are separated from each other.

As the arrangement-direction movement mechanism 62, a motor drive mechanism using ball screws is used, for example. The ball screws of the arrangement-direction movement mechanism 62 are provided above the plurality of processing tanks 310, 33, 311 to 314 so as to extend along the arrangement direction of the cleaning modules 311 to 314. As illustrated in FIG. 4, sets each formed of a pair of arms, an upward/downward movement mechanism, and a turn mechanism, in other words, the first wafer grasp mechanism 601 and the second wafer grasp mechanism 602, are placed below the arrangement-direction movement mechanism 62 so as to hang.

<Operations of Arms>

Next, with reference to FIGS. 5A to 5E, an example of operations of the pair of second arms 612 will be described. As described above, each of the cleaning modules 310 and 311 to 314 is partitioned off by the casing 91 to prevent fluid being used from being scattered to the outside during cleaning of the wafer W, and the arm passage opening 94 is formed in the side surface of the casing 91. The arm passage opening 94 is provided with a shutter 97 that can be opened and closed.

Figure 5A:
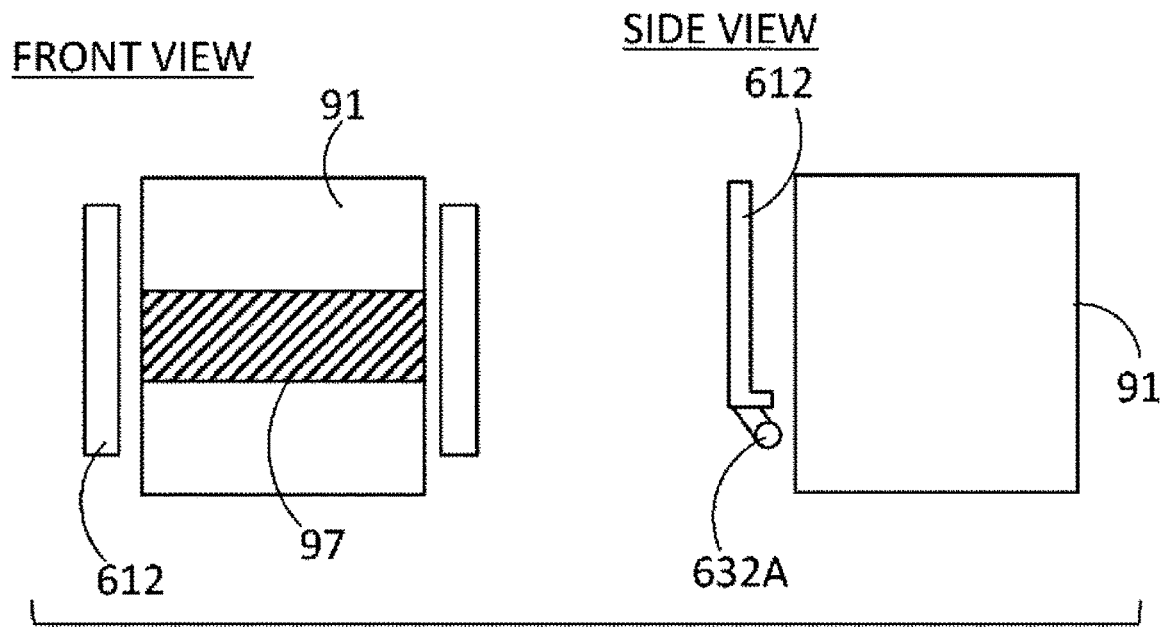
FIG. 5A is a diagrammatic view for explaining operations of a second wafer grasp mechanism of the conveyance mechanism illustrated in FIG. 4.

To take out the cleaned wafer W from the casing 91, as illustrated in FIG. 5A, the pair of second arms 612 having the tip ends oriented upward is driven by the arrangement-direction movement mechanism 62, to be moved to a standby position adjacent to the casing 91. In the present embodiment, by orienting the tip ends of the pair of second arms 612 upward, it is possible to move the pair of second arms 612 to a standby position adjacent to the casing 91 even when the shutter 97 of the casing 91 is closed. Thus, an operation of taking out a wafer can be started earlier, thereby improving the throughput of the processes as a whole.

Figure 5B:
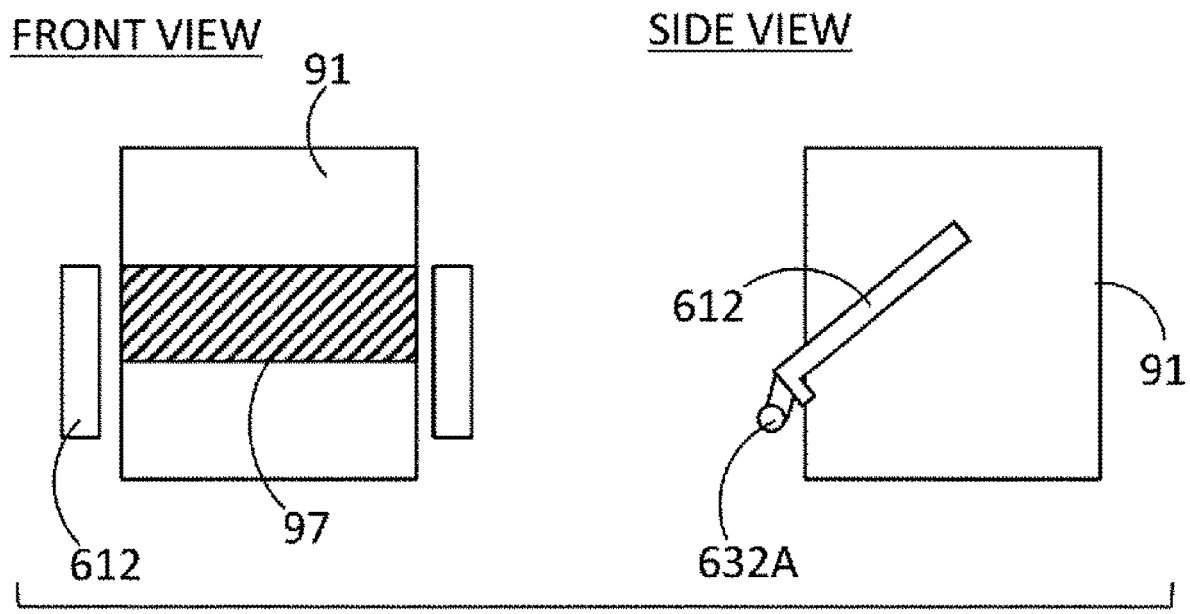
FIG. 5B is a diagrammatic view for explaining the operations of the second wafer grasp mechanism of the conveyance mechanism illustrated in FIG. 4.
Figure 5C:
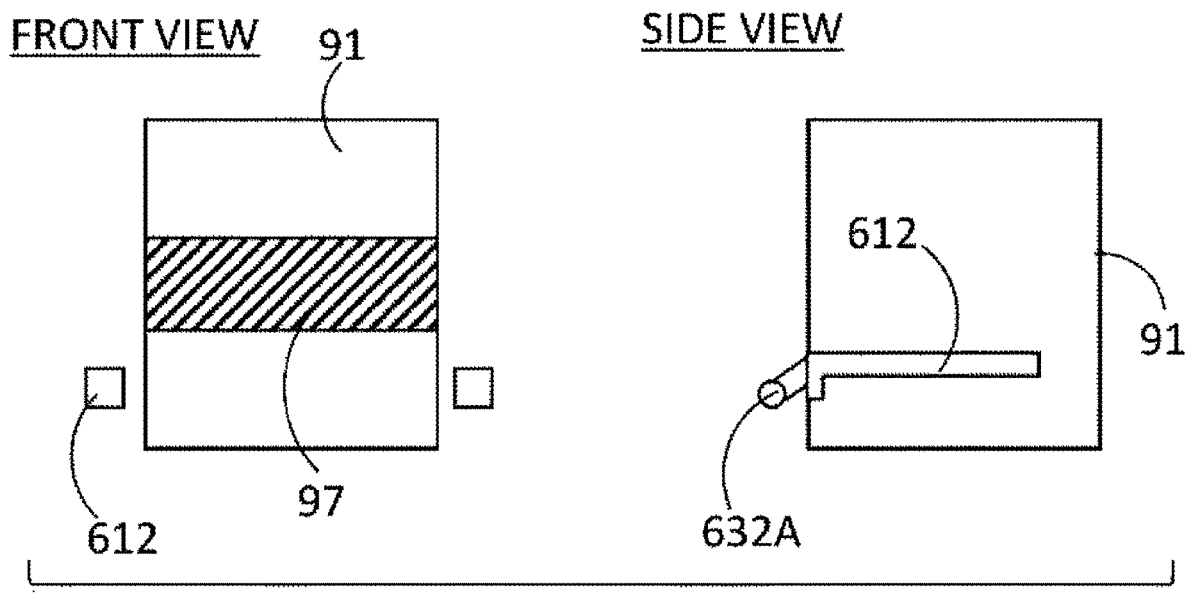
FIG. 5C is a diagrammatic view for explaining the operations of the second wafer grasp mechanism of the conveyance mechanism illustrated in FIG. 4.

Subsequently, as illustrated in FIGS. 5B and 5C, the pair of second arms 612 is driven by the second turn mechanism 632, to be turned about the rotation axis 632A. In the example illustrated in the drawings, the pair of second arms 612 is rotated 90 degrees clockwise about the rotation axis 632A when seen from the side, and the tip ends of the pair of second arms 612 are oriented horizontally.

Figure 5D:
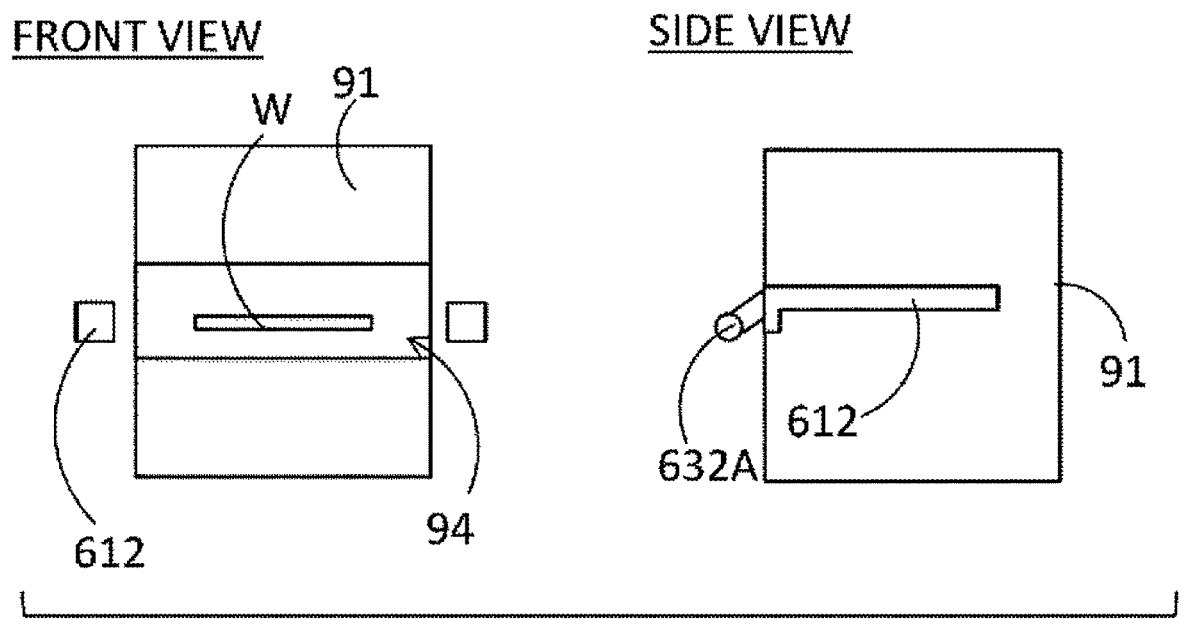
FIG. 5D is a diagrammatic view for explaining the operations of the second wafer grasp mechanism of the conveyance mechanism illustrated in FIG. 4.

Subsequently, as illustrated in FIG. 5D, the pair of second arms 612 is driven by the second upward/downward movement mechanism 642, to be elevated to a position at the same height as the arm passage opening 94. At that time, the shutter 97 is retracted and the arm passage opening 94 is opened.

Figure 5E:
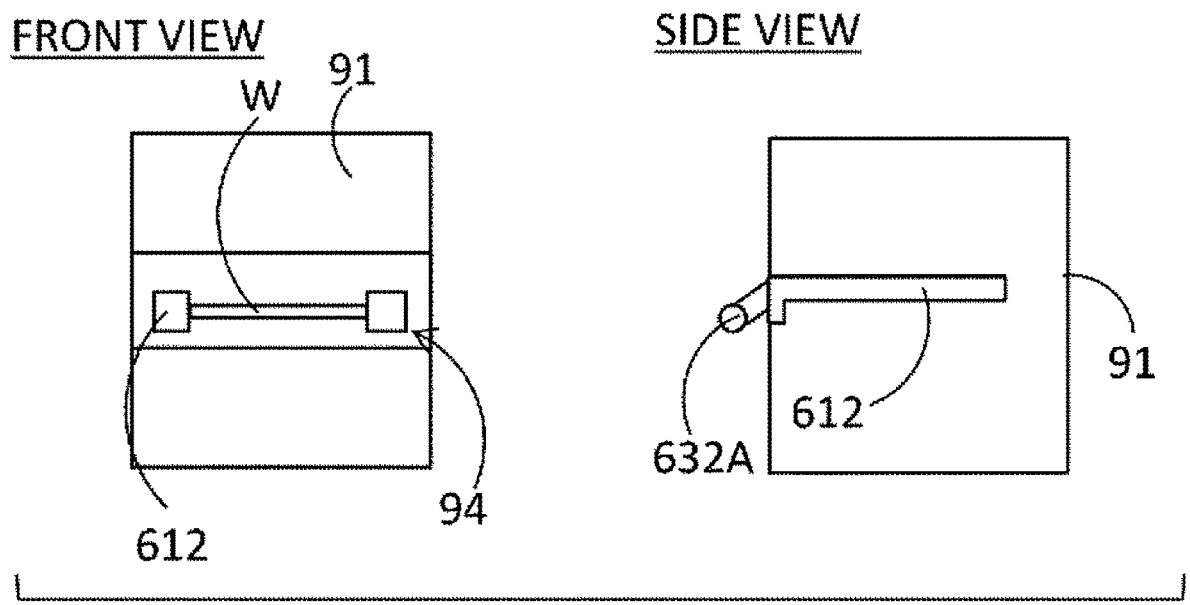
FIG. 5E is a diagrammatic view for explaining the operations of the second wafer grasp mechanism of the conveyance mechanism illustrated in FIG. 4.

Subsequently, as illustrated in FIG. 5E, the pair of second arms 612 is driven by the second open/close mechanism 662, to be closed in a direction in which the arms are brought close to each other. The pair of second arms 612 is inserted into the casing 91 through the arm passage opening 94 and grasps the wafer W in the casing 91. Then, the pair of second arms 612 grasping the wafer W is driven by the arrangement-direction movement mechanism 62, to be moved to a next cleaning module.

To load the wafer W that is yet to be cleaned, into the casing 91, the operations described above with reference to FIGS. 5A to 5E are performed in a reverse order. More specifically, as illustrated in FIG. 5E, the pair of second arms 612 grasping the wafer W is driven by the arrangement-direction movement mechanism 62, to be moved to the inside of the casing 91 through the arm passage opening 94.

Subsequently, as illustrated in FIG. 5D, the pair of second arms 612 is driven by the second open/close mechanism 662, to be opened in a direction in which the arms are separated from each other. Then, the pair of second arms 612 is put out of the casing 91 through the arm passage opening 94.

Subsequently, as illustrated in FIG. 5C, the pair of second arms 612 is driven by the second upward/downward movement mechanism 642, to be lowered to a position lower than the arm passage opening 94. At that time, the arm passage opening 94 is closed by the shutter 97 and then a cleaning process of the wafer W is started in the casing 91.

Subsequently, as illustrated in FIGS. 5B and 5A, the pair of second arms 612 is driven by the second turn mechanism 632, to be turned about the rotation axis 632A. In the example illustrated in the drawings, the pair of second arms 612 is rotated 90 degrees counterclockwise about the rotation axis 632A when seen from the side and the tip ends of the pair of second arms 612 are oriented upward. Then, the pair of second arms 612 having the tip ends oriented upward is driven by the arrangement-direction movement mechanism 62, to be moved to a next cleaning module. In the present embodiment, when the second turn mechanism 632 turns the pair of second arms 612 to orient the tip ends of the arms upward, the second upward/downward movement mechanism 642 lowers the pair of second arms 612, which can reduce a required space above the pair of second arms 612.

<Wafer Cleaning Process>

Next, an example of a process of cleaning the wafer W by using the cleaning section 13 having the above-described configuration will be described. In the present embodiment, the wafers W being conveyed from the polishing section 12 to the cleaning section 13 are allocated to the first processing unit 30a and the second processing unit 30b by the conveyance robot 23, and are cleaned in parallel in the first processing unit 30a and the second processing unit 30b. Thus, the throughput of the processes can be improved as a whole.

A wafer cleaning process in the second processing unit 30b is similar to a wafer cleaning process in the first processing unit 30a, and thus the wafer cleaning process in the first processing unit 30a will be described below.

Figure 6A:
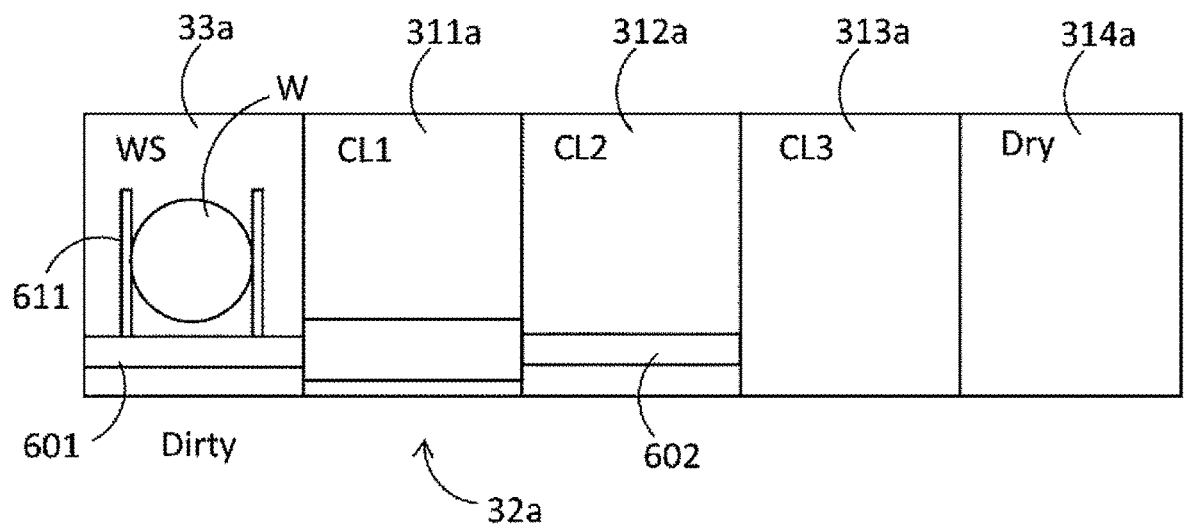
FIG. 6A is a diagrammatic view for explaining operations of a first processing unit.

As illustrated in FIG. 6A, first, while respective tip ends of the pair of first arms 611 and the pair of second arms 612 are oriented upward, the first wafer grasp mechanism 601 and the second wafer grasp mechanism 602 are driven by the arrangement-direction movement mechanism 62, to be moved along the arrangement direction of the plurality of processing tanks 310, 33, and 311 to 314. The first and second wafer grasp mechanisms 601 and 602 are stopped to stand still in a standby position where the pair of first arms 611 is adjacent to the wafer station 33. Then, the pair of first arms 611 is driven by the first turn mechanism 631, to be turned about the rotation axis 631A, so that the tip ends of the pair of first arms 611 are oriented horizontally. The shutter of the wafer station 33 is retracted to open the arm passage opening 74, and thereafter the pair of first arms 611 is inserted into the wafer station 33 through the arm passage opening 74 and grasps the wafer W held on the stage 72. After the wafer W is grasped by the pair of first arms 611, the stage 72 is retracted downward.

Figure 6B:
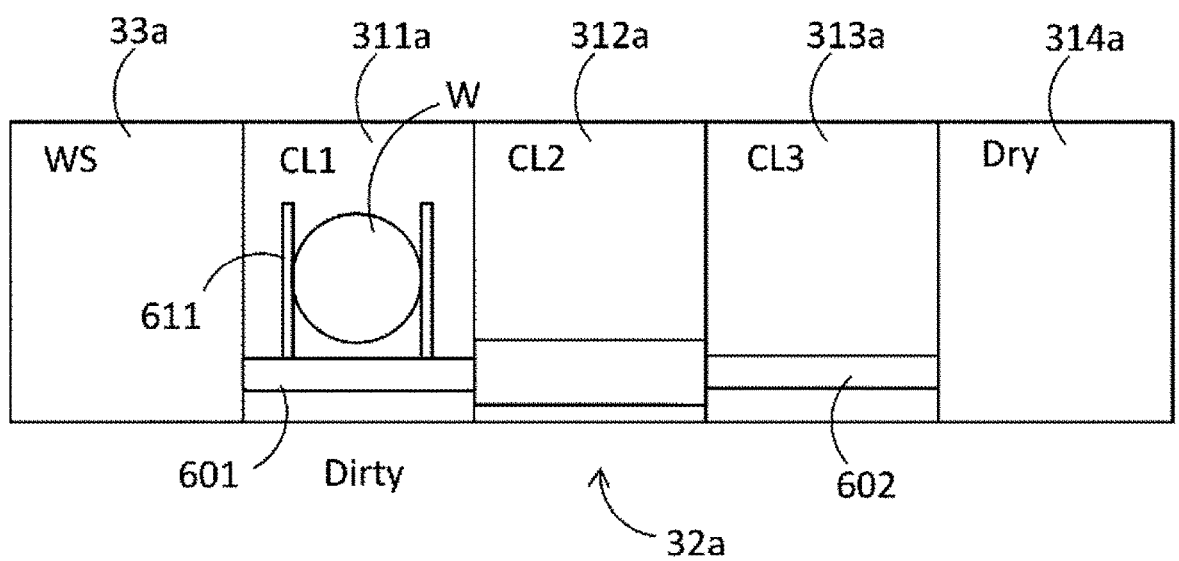
FIG. 6B is a diagrammatic view for explaining the operations of the first processing unit.

Subsequently, as illustrated in FIG. 6B, the shutter 97 of the first cleaning module 331 is retracted to open the arm passage opening 94, and thereafter the first wafer grasp mechanism 601 and the second wafer grasp mechanism 602 are driven by the arrangement-direction movement mechanism 62, to be moved along the arrangement direction of the plurality of processing tanks 310, 33, and 311 to 314. Then, the wafer W grasped by the pair of first arms 611 is conveyed from the wafer station 33 to the first cleaning module 331 and is transferred to the cleaner of the first cleaning module 331. Subsequently, the pair of first arms 611 are put out of the casing 91 of the first cleaning module 331, and thereafter the arm passage opening 94 is closed by the shutter 97. Then, the wafer W is cleaned by the cleaner of the first cleaning module 331.

After a cleaning process in the first cleaning module 331 is ended, the shutter 97 is retracted to open the arm passage opening 94. The pair of first arms 611 is inserted into the casing 91 of the first cleaning module 331 through the arm passage opening 94 and grasps the wafer W having been cleaned by the cleaner.

Figure 6C:
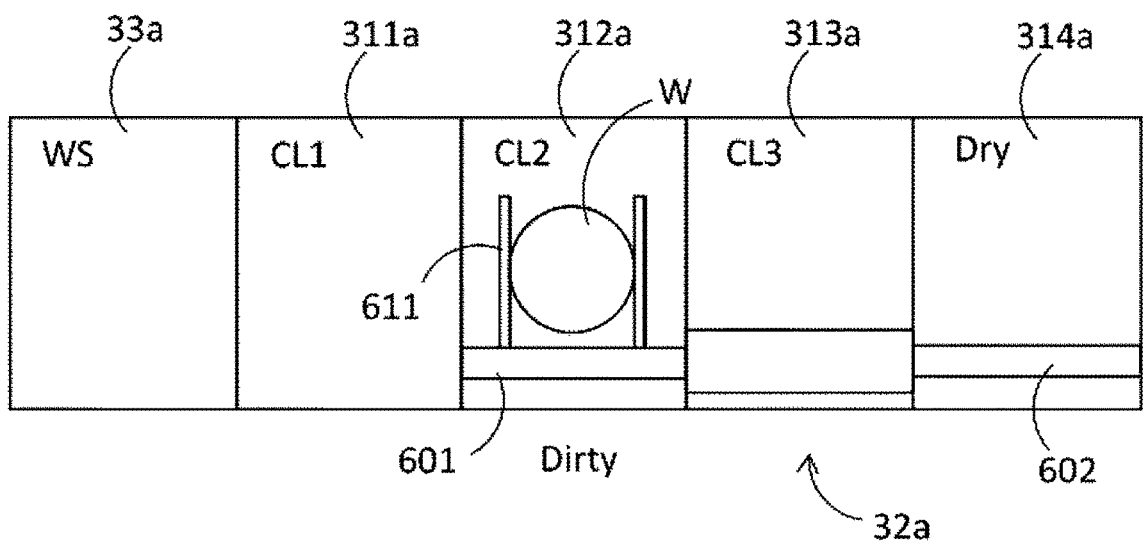
FIG. 6C is a diagrammatic view for explaining the operations of the first processing unit.

Subsequently, as illustrated in FIG. 6C, the shutter 97 of the second cleaning module 332 is retracted to open the arm passage opening 94, and thereafter the first wafer grasp mechanism 601 and the second wafer grasp mechanism 602 are driven by the arrangement-direction movement mechanism 62, to be moved along the arrangement direction of the plurality of processing tanks 310, 33, and 311 to 314. The wafer W grasped by the pair of first arms 611 is conveyed from the first cleaning module 331 to the second cleaning module 332 and is transferred to the cleaner of the second cleaning module 332. Subsequently, the pair of first arms 611 is put out of the casing 91 of the second cleaning module 332, and thereafter the arm passage opening 94 is closed by the shutter 97. Then, the wafer W is cleaned by the cleaner of the second cleaning module 332.

Figure 6D:
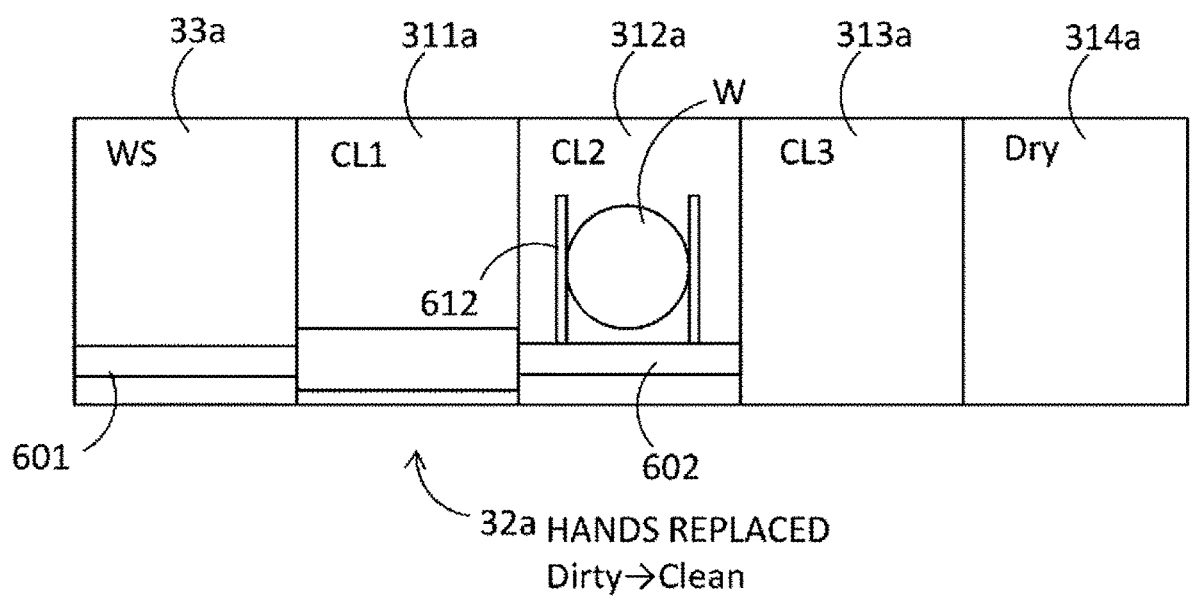
FIG. 6D is a diagrammatic view for explaining the operations of the first processing unit.

Subsequently, as illustrated in FIG. 6D, the pair of first arms 611 is driven by the first turn mechanism 631, to be turned about the rotation axis 631A, so that the tip ends of the pair of first arms 611 are oriented upward. Then, while the respective tip ends of the pair of first arms 611 and the pair of second arms 612 are oriented upward, the first wafer grasp mechanism 601 and the second wafer grasp mechanism 602 are driven by the arrangement-direction movement mechanism 62, to be moved along the arrangement direction of the plurality of processing tanks 310, 33, and 311 to 314. The first and second wafer grasp mechanisms 601 and 602 are stopped to stand still in a standby position where the pair of second arms 612 is adjacent to the second cleaning module 332. The pair of second arms 612 is driven by the second turn mechanism 632, to be rotated about the rotation axis 632A, so that the tip ends of the pair of second arms 612 are oriented horizontally.

After a cleaning process in the second cleaning module 332 is ended, the shutter 97 is retracted to open the arm passage opening 94. The pair of second arms 612 is inserted into the casing 91 of the second cleaning module 332 through the arm passage opening 94 and grasps the wafer W having been cleaned by the cleaner.

As described above, in the present embodiment, the wafer W that is yet to be cleaned in the second cleaning module 332 is grasped and conveyed by the pair of first arms 611, and the wafer W that has been cleaned in the second cleaning module 332 is grasped and conveyed by the pair of second arms 612. In other words, the arms are replaced in the second cleaning module 332. This can prevent the wafer W having been cleaned in the second cleaning module 332 from being contaminated due to contact with the pair of first arms 611.

Figure 6E:
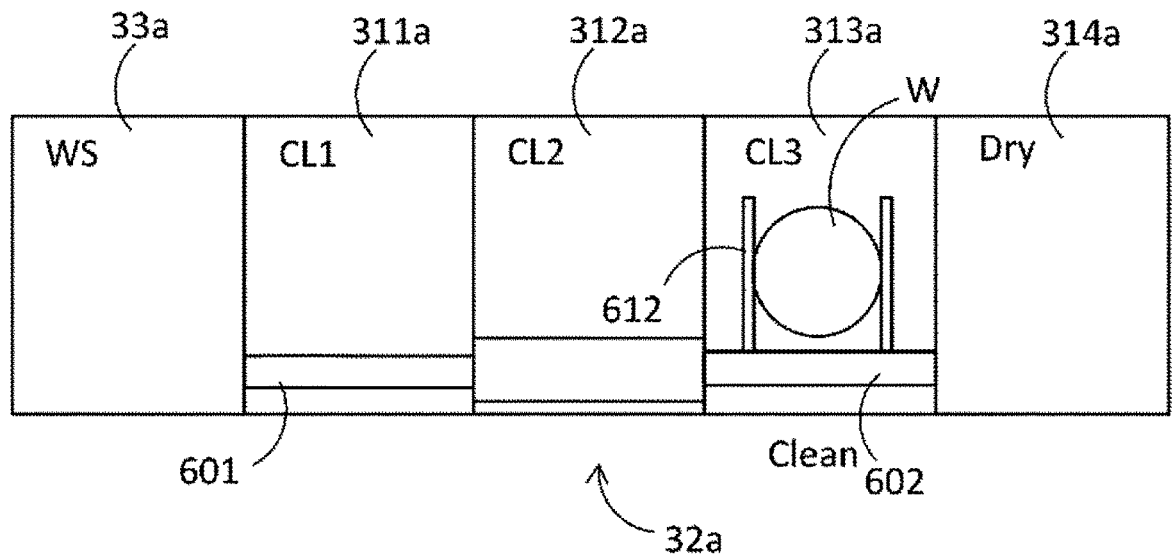
FIG. 6E is a diagrammatic view for explaining the operations of the first processing unit.

Subsequently, as illustrated in FIG. 6E, the shutter 97 of the third cleaning module 333 is retracted to open the arm passage opening 94, and thereafter the first wafer grasp mechanism 601 and the second wafer grasp mechanism 602 are driven by the arrangement-direction movement mechanism 62, to be moved along the arrangement direction of the plurality of processing tanks 310, 33, and 311 to 314. The wafer W grasped by the pair of second arms 612 is conveyed from the second cleaning module 332 to the third cleaning module 333 and is transferred to the cleaner of the third cleaning module 333. Subsequently, the pair of second arms 612 is put out of the casing 91 of the third cleaning module 333, and thereafter the arm passage opening 94 is closed by the shutter 97. Then, the wafer W is cleaned by the cleaner of the third cleaning module 333.

After a cleaning process in the third cleaning module 333 is ended, the shutter 97 is retracted to open the arm passage opening 94. The pair of second arms 612 is inserted into the casing 91 of the third cleaning module 333 through the arm passage opening 94 and grasps the wafer W having been cleaned by the cleaner.

Figure 6F:
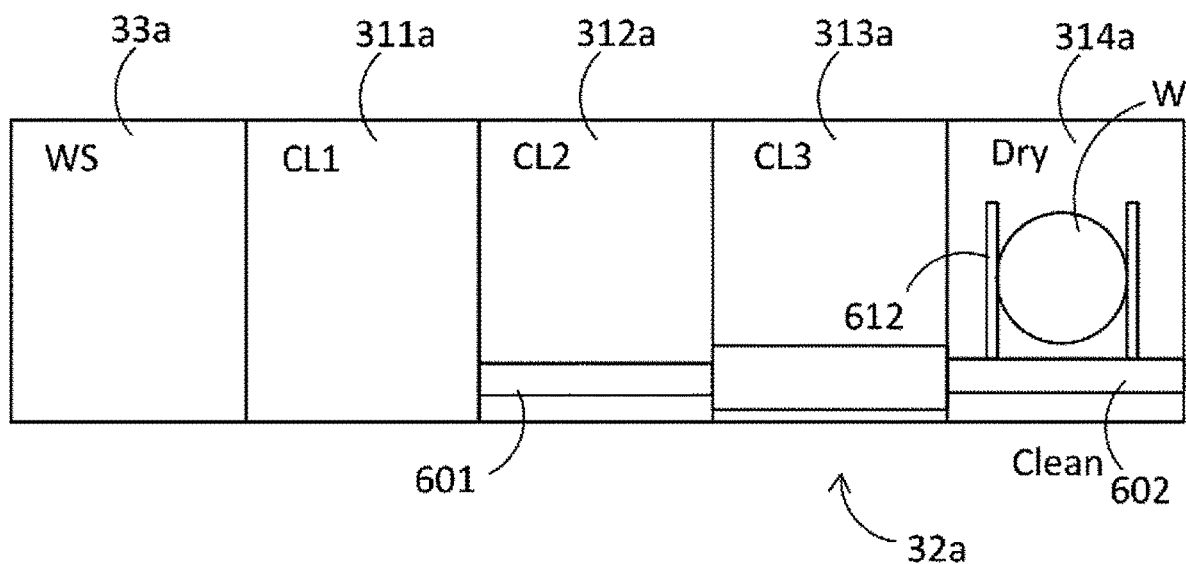
FIG. 6F is a diagrammatic view for explaining the operations of the first processing unit.

Subsequently, as illustrated in FIG. 6F, the shutter 97 of the fourth cleaning module 334 is retracted to open the arm passage opening 94, and thereafter the first wafer grasp mechanism 601 and the second wafer grasp mechanism 602 are driven by the arrangement-direction movement mechanism 62, to be moved along the arrangement direction of the plurality of processing tanks 310, 33, and 311 to 314. The wafer W grasped by the pair of second arms 612 is conveyed from the third cleaning module 333 to the fourth cleaning module 334 and is transferred to the cleaner of the fourth cleaning module 334. Subsequently, the pair of second arms 612 is put out of the casing 91 of the fourth cleaning module 334, and thereafter the arm passage opening 94 is closed by the shutter 97. Then, the wafer W is cleaned by the cleaner of the fourth cleaning module 334.

After a cleaning process in the fourth cleaning module 334 is ended, the shutter 97 is retracted to open the arm passage opening 94. Hands of the conveyance robot 111 of the above-described loading/unloading section 11 are inserted into the casing 91 of the fourth cleaning module 334a through the arm passage opening 94, and the wafer W having been cleaned by the cleaner is taken out to the loading/unloading section 11.

<Airstream Control in Conveyance Space>

In the meantime, as mentioned in the paragraphs regarding a solution to be overcome by the invention, in a cleaning unit of a substrate processing apparatus, dust generated from a conveyance mechanism for conveying a wafer may probably form a defect source. Thus, in the present embodiment, for the purpose of reducing defects of a wafer, airstream control described below is exercised in the conveyance space 40 of the cleaning section 13.

In the present embodiment, as illustrated in FIGS. 2A and 2B, an air guide duct 41 is provided so as to extend along the arrangement direction in each of the conveyance space 40 of the first processing unit 30a and the conveyance space 40 of the second processing unit 30b. Meanwhile, the conveyance space 40 of the first processing unit 30a and the conveyance space 40 of the second processing unit 30b are separated into upper and lower segments by the partition wall 39, thereby preventing a difference in airstream between the first processing unit 30a and the second processing unit 30b from being caused.

As illustrated in FIG. 2A, the air guide duct 41 is connected with a fan filter unit 44 that supplies normal airstream to the inside of the air guide duct 41. In the example illustrated in the drawings, the fan filter unit 44 is connected with one lengthwise end (the right end in FIG. 2A) of the air guide duct 41.

Further, in the air guide duct 41, openings 410, 43, and 411 to 413 are formed in parts facing the processing tanks 310, 33, and 311 to 313, respectively. Normal airstream supplied from the fan filter unit 44 passes through the inside of the air guide duct 41 and is blown out from the openings 410, 43, and 411 to 413 toward the top plates of the processing tanks 310, 33, and 311 to 313. As illustrated in FIG. 2B, on a back-surface side (the right side in FIG. 2B) of the air guide duct 41, the partition walls 39 extending in parallel with a back surface of the air guide duct 41 are provided to separate a space between the air guide duct 41 and the top plate of each of the processing tanks 310, 33, and 311 to 313, as well as a space between the side plates of every adjacent ones of the processing tanks 310, 33, and 311 to 313, into a front-surface side and a back-surface side. This prevents airstream blown out from each of the openings 410, 43, and 411 to 413 from flowing out to the back-surface side of the processing tank 311. Thus, airstream blown out from each of the openings 410, 43, and 411 to 413 creates a positive pressure on the front-surface sides and the side-surface sides of the processing tanks 310, 33, and 311 to 313.

In the present embodiment, the plurality of openings 410, 43, and 411 to 413 are formed in such a manner that the openings located closer to the one end (the right end in FIG. 2A) are smaller. In other words, the openings located farther from the fan filter unit 44 are formed so as to be larger. Specifically, for example, with respect to the size of the opening denoted by the reference sign 410 used as the reference, the sizes of the openings denoted by the reference signs 43, 411, 412, and 413 are 90%, 80%, 70%, and 60%, respectively. Additionally, the shapes and the sizes of the openings 410, 43, and 411 to 413 may be appropriately determined based on results of experiments using a tester or results of analyses using fluid analysis software.

The velocity of airstream supplied from one end of the air guide duct 41 decreases as it becomes farther from the fan filter unit 44, due to air resistance. However, the openings located farther from the fan filter unit 44 are formed so as to be larger, and thus a flow rate of airstream blown out from the openings located far from the fan filter unit 44 can be relatively increased. This allows airstream to be sufficiently blown out from each of the openings 410, 43, and 411 to 413.

In the example illustrated in the drawings, along the arrangement direction, the center of each of the openings 410, 43, and 411 to 413 is aligned to a position closer to the one end (the right end in FIG. 2A) than the center in its corresponding processing tank 310, 33, or 311 to 313. This allows airstream blown out from the openings 410, 43, and 411 to 413 to sufficiently flow along not only the front surfaces and the downstream side surfaces, but also the upstream side surfaces, of the processing tanks 310, 33, and 311 to 313 in the conveyance space 40, as illustrated in FIG. 2A.

Positional relationships between the processing tanks 310, 33, and 311 to 313 and the air guide duct 41 are similar to each other, and thus a positional relationship between the processing tank denoted by the reference sign 311 and the air guide duct 41 will be described below. FIG. 7 is a perspective view for explaining a positional relationship between the air guide duct 41 and the processing tank 311. FIG. 8 is a side view for explaining a positional relationship among the air guide duct 41, the processing tank 311, and the conveyance mechanism 32.

As illustrated in FIGS. 7 and 8, the air guide duct 41 is placed above the processing tank 311. In the example illustrated in the drawings, the arrangement-direction movement mechanism 62 of the conveyance mechanism 32 is placed above the processing tank 311 and the air guide duct 41 is placed between the processing tank 311 and the arrangement-direction movement mechanism 62.

Because of the placement of the air guide duct 41 above the processing tank 311, airstream blown out from the opening 411 of the air guide duct 41 flows downward along the front surface and the side surfaces of the processing tank 311 in the conveyance space 40. This can prevent dust floating in the conveyance space 40 from being flown up by the airstream.

As illustrated in FIG. 8, the casing 91 of the processing tank 311 is connected with an exhaust duct 98. The exhaust duct 98 exhausts the processing tank 311, thereby creating a negative pressure in the processing tank 311 (refer to FIG. 2B). Thus, airstream blown out from the opening 411 of the air guide duct 41 to the conveyance space 40 flows along the front surface and the side surfaces of the processing tank 311, and thereafter is attracted to the arm passage opening 94. Then, the airstream enters into the casing 91 through the opening 94 and is exhausted from the exhaust duct 98.

In this regard, because of the placement of the air guide duct 41 between the processing tank 311 and the arrangement-direction movement mechanism 62, airstream blown out from the opening 411 of the air guide duct 41 to the conveyance space 40 can orderly flow into the processing tank 311 without being blocked or stagnated by the conveyance mechanism 32.

Additionally, the shutter 97 is placed with a clearance of several millimeters being left from the casing 94 so that no dust is generated due to rubbing of the shutter 97 against the casing 94 when the shutter 97 is opened or closed. Thus, also while the shutter 97 is closed, because of a negative pressure created in the casing 91 by the exhaust duct 98, airstream blown out from the opening 411 of the air guide duct 41 to the conveyance space 40 flows along the front surface and the side surfaces of the processing tank 311, and thereafter is attracted to the arm passage opening 94. Then, the airstream enters into the casing 94 through the clearance between the shutter 97 and the casing 94, and is exhausted from the exhaust duct 98.

In the present embodiment, as illustrated in FIG. 8, the arrangement-direction movement mechanism 62 is covered with a cover 65 extending along the arrangement direction of the plurality of processing tanks 310, 33, and 313 to prevent dust generated from the arrangement-direction movement mechanism 62 from being scattered in the conveyance space 40.

An opening is formed in a part on a front side (the right side in FIG. 8) in a bottom surface of the cover 65, and the first wafer grasp mechanism 601 and the second wafer grasp mechanism 602 are inserted through the opening and placed below the arrangement-direction movement mechanism 62 so as to hang. This allows the first wafer grasp mechanism 601 and the second wafer grasp mechanism 602 to be moved linearly along the arrangement direction without physically interfering with the cover 65.

As illustrated in FIG. 8, the cover 65 is connected with a second exhaust duct 68. The second exhaust duct 68 exhausts the cover 65, thereby creating a negative pressure in the cover 65 (refer to FIG. 2B). Thus, a part of airstream blown out from the opening 411 of the air guide duct 41 to the conveyance space 40 is attracted to the opening in the bottom surface of the cover 65, flows into the cover 65 through the opening, and is then exhausted from the second exhaust duct 68. Formation of such airstream flow can effectively prevent dust generated from the arrangement-direction movement mechanism 62 from being scattered in the conveyance space 40 through the opening in the bottom surface of the cover 65.

According to the above-described present embodiment, the first processing unit 30a and the second processing unit 30b placed in upper and lower two stages can process a plurality of wafers in parallel, thereby achieving high throughput. Further, the air guide duct 41 is provided so as to extend along the arrangement direction of the plurality of processing tanks 310, 33, and 311 to 313 in the conveyance space 40 of each of the processing units 30a and 30b, and the openings 410, 43, and 411 to 413 are formed in parts facing the processing tanks 310, 33, and 311 and 313, respectively, in the air guide duct 41. Thus, airstream can orderly flow through the conveyance space 40 without being blocked or stagnated by the conveyance mechanism 32, which prevents dust generated from the conveyance mechanism 32 from forming a defect source. Further, the conveyance space 40 of the first cleaning unit 30a and the conveyance space 40 of the second cleaning unit 30b are separated into upper and lower segments by the partition wall 39, which prevents a difference in airstream between the first processing unit 30a and the second processing unit 30b from being caused. Combining organically such effects as described above can effectively reduce defects of a wafer in each of the first processing unit 30a and the second processing unit 30b.

Additionally, although a polishing apparatus that polishes a wafer has been dealt with as an example in the above-described embodiment, the present invention is applicable to not only a polishing apparatus, but also the other substrate processing apparatuses. For example, there may be formed a substrate processing apparatus different from a polishing apparatus, in which a plurality of polishing units are replaced by the other substrate processing units (such as film forming units including a plating unit or a CVD unit, a wet-etching unit, or a dry-etching unit, for example). Further, a plurality of different substrate processing units may be combined and placed so as to be arranged along a predetermined direction.

Further, while the processing units 30a and 30b are placed in upper and lower two stages in the above-described embodiment, the present invention is not limited to that. The processing units 30a and 30b may be placed in one stage, or three or more stages including upper, middle, and lower stages.

While the preferred embodiment of the present invention has been described hereinabove, the present invention is not limited to the above-described embodiment, and it goes without saying that the present invention can be carried out in various different forms within a scope of technical idea thereof.

The invention claimed is:

1. A substrate processing apparatus comprising
a first processing unit and a second processing unit placed in upper and lower two stages, wherein
each of the first processing unit and the second processing unit has:
a plurality of processing tanks arranged in series;
a partition wall defining a conveyance space extending along an arrangement direction outside the plurality of processing tanks;
a conveyance mechanism placed in the conveyance space, the conveyance mechanism being configured to convey a substrate between the processing tanks along the arrangement direction; and
an air guide duct provided so as to extend along the arrangement direction in the conveyance space,
the air guide duct is connected with a fan filter unit,
each of the processing tanks is connected with an exhaust duct,
a plurality of openings are formed in the air guide duct, each opening facing a respective on of the plurality of processing tanks,
the conveyance space of the first processing unit and the conveyance space of the second processing unit are separated into upper and lower segments by the partition wall,
the fan filter unit is located at and connected with one lengthwise end of the air guide duct, and
each of the plurality of openings is formed to be relatively smaller in size as the openings proceed along the air guide duct in the direction towards said one lengthwise end of the air guide duct.

2. The substrate processing apparatus according to claim 1, wherein the air guide duct is placed above the plurality of processing tanks.

3. The substrate processing apparatus according to claim 1, wherein
the conveyance mechanism has:
a pair of arms configured to be opened and closed and grasp the substrate; and
an arrangement-direction movement mechanism configured to move the pair of arms linearly along the arrangement direction,
the arrangement-direction movement mechanism is covered with a cover extending along the arrangement direction, and
the cover is connected with a second exhaust duct.

4. The substrate processing apparatus according to claim 3, wherein
the arrangement-direction movement mechanism is placed above the plurality of processing tanks, and
the pair of arms are placed below the arrangement-direction movement mechanism so as to hang.

5. The substrate processing apparatus according to claim 4, wherein the air guide duct is placed between the plurality of processing tanks and the arrangement-direction movement mechanism.

6. The substrate processing apparatus according to claim 1, wherein,
along the arrangement direction, a center of the opening is aligned to a position closer to the one end than a center in a corresponding processing tank of the processing tanks.

7. The substrate processing apparatus according to claim 1, wherein
the processing tank is a cleaning module.

8. The substrate processing apparatus according to claim 1, wherein
the plurality of processing tanks includes a first processing tank and a second processing tank, a space being provided therebetween, so that a first airstream blown out from a first opening facing the first processing tank is guided to the first processing tank and the space, and a second airstream blown out from a second opening facing the second processing tank is guided to the second processing tank and the space.

9. The substrate processing apparatus according to claim 1, wherein
the farther each respective opening is from the fan filter unit, the larger said opening is formed to be.

10. A substrate processing apparatus comprising:
a plurality of processing tanks arranged in series;
a partition wall defining a conveyance space extending along an arrangement direction outside the plurality of processing tanks;
a conveyance mechanism placed in the conveyance space, the conveyance mechanism being configured to convey a substrate between the processing tanks along the arrangement direction; and
an air guide duct provided so as to extend along the arrangement direction in the conveyance space, wherein
the air guide duct is connected with a fan filter unit,
each of the processing tanks is connected with an exhaust duct,
a plurality of openings are formed in the air guide duct, each opening facing a respective one of the plurality of processing tanks,
the fan filter unit is located at and connected with one lengthwise end of the air guide duct, and
each of the plurality of openings is formed to be relatively smaller in size as the openings proceed along the air guide duct in the direction towards said one lengthwise end of the air guide duct.

11. The substrate processing apparatus according to claim 10, wherein the air guide duct is placed above the plurality of processing tanks.

12. The substrate processing apparatus according to claim 10, wherein
the conveyance mechanism has:
a pair of arms configured to be opened and closed and grasp the substrate; and
an arrangement-direction movement mechanism configured to move the pair of arms linearly along the arrangement direction,
the arrangement-direction movement mechanism is covered with a cover extending along the arrangement direction, and
the cover is connected with a second exhaust duct.

13. The substrate processing apparatus according to claim 12, wherein
the arrangement-direction movement mechanism is placed above the plurality of processing tanks, and
the pair of arms are placed below the arrangement-direction movement mechanism so as to hang.

14. The substrate processing apparatus according to claim 13, wherein the air guide duct is placed between the plurality of processing tanks and the arrangement-direction movement mechanism.

15. The substrate processing apparatus according to claim 10, wherein,
along the arrangement direction, a center of the opening is aligned to a position closer to the one end than a center in a corresponding processing tank of the processing tanks.

16. The substrate processing apparatus according to claim 10, wherein
the processing tank is a cleaning module.

17. The substrate processing apparatus according to claim 10, wherein
the plurality of processing tanks includes a first processing tank and a second processing tank, a space being provided therebtween, so that a first airstream blown out from a first opening facing the first processing tank is guided to the first processing tank and the space, and a second airstream blown out from a second opening facing the second processing tank is guided to the second processing tank and the space.

18. The substrate processing apparatus according to claim 10, wherein
the farther each respective opening is from the fan filter unit, the larger said opening is formed to be.

19. A substrate processing apparatus comprising:
a first processing unit and a second processing unit placed and lower two stages, wherein
each of the first processing unit and the second processing unit has:
a plurality of processing tanks arranged in series;
a partition wall defining a conveyance space extending along an arrangement direction outside the plurality of processing tanks;
a conveyance mechanism placed in the conveyance space, the conveyance mechanism being configured to convey a substrate between the processing tanks along the arrangement direction; and
an air guide duct provided so as to extend along the arrangement direction in the conveyance space,
the air guide duct is connected with a fan filter unit,
each of the processing tanks is connected with an exhaust duct,
a plurality of openings are formed in the air guide duct, each opening facing a surface not provided with an arm passage opening for allowing an arm of the conveyance mechanism of a respective one of the plurality of proccessing tanks,
the conveyance space of the first processing unit and the conveyance space of the second processing unit are separated into upper and lower segments by the partition wall, the fan filter unit is connected with one end of the air guide duct, and each of plurality of openings is formed to be relatively smaller in size as the openings proceed along the air guide duct in the direction towards said one end of the air guide duct.

20. The substrate processing apparatus according to claim 19, wherein the guide duct is placed above the plurality of processing tanks.

21. The substrate processing apparatus according to claim 19, wherein
the conveyance mechanism has:
a pair of arms configured to be opened and closed and grasp the substrate; and
an arrangement-direction movement mechanism configured to move the pair of arms linearly along the arrangement direction,
the arrangement-direction movement mechanism is covered with a cover extending along the arrangement direction, and
the cover is connected with a second exhaust duct.

22. The substrate processing apparatus according to claim 21, wherein
the arrangement-direction movement mechanism is placed above the plurality of processing tanks, and
the pair of arms are placed below the arrangement-direction movement mechanism so as to hang.

23. The substrate processing apparatus according to claim 22, wherein the air guide duct is placed between the plurality of processing tanks and the arrangement-direction movement mechanism.

24. The substrate processing apparatus according to claim 19, wherein,
along the arrangement direction, a center of the opening is aligned to a position closer to the one end than a center in a corresponding processing tank of the processing tanks.

25. The substrate processing apparatus according to claim 19, wherein the processing tank is a cleaning module.

26. The substrate processing apparatus according to claim 19, wherein
the plurality of processing tanks includes a first processing tank and a second processing tanks, a space being provided therebetween, so that a first airstream blown out from a first opening facing the first processing tank is guided to the first processing tank and the space, and a second airstream blown out from a second opening facing the second processing tank is guided to the second processing tank and the space.

27. The substrate processing apparatus according to claim 19, wherein
the farther each respective opening is from the fan filter unit, the larger said opening is formed to be.

28. A substrate processing apparatus comprising:
a plurality of processing tanks arranged in series;
a partition wall defining a conveyance space extending along an arrangement direction outside the plurality of processing tanks;
a conveyance mechanism placed in the conveyance space, the conveyance mechanism being configured to convey a substrate between the processing tanks along the arrangement direction; and
an air guide duct provided so as to extend along the arrangement direction in the conveyance space, wherein
the air guide duct is connected with a fan filter unit, each of the processing tanks is connected with an exhaust duct, a plurality of openings is formed in the air guide duct, each opening facing a surface not provided with an arm passage opening for allowing an arm of the conveyance mechanism of a respective one of the plurality of processing tanks, the fan filter unit is connected with one end of the air guide duct, and each of the plurality of openings is formed to be relatively smaller in size as the openings proceed along the air guide duct in the direction towards said one end of the air guide duct.

29. The substrate processing apparatus according to claim 28, wherein the air guide duct is placed above the plurality of processing tanks.

30. The substrate processing apparatus according to claim 28, wherein
the conveyance mechanism has:
a pair of arms configured to be opened and closed and grasp the substrate; and
an arrangement-direction movement mechanism configured to move the pair of arms linearly along the arrangement direction,
the arrangement-direction movement mechanism is covered with a cover extending along the arrangement direction, and
the cover is connected with a second exhaust duct.

31. The substrate processing apparatus according to claim 30, wherein
the arrangement-direction movement mechanism is placed above the plurality of processing tanks, and
the pair of arms are placed below the arrangement-direction movement mechanism so as to hang.

32. The substrate processing apparatus according to claim 31, wherein the air guide duct is placed between the plurality of processing tanks and the arrangement-direction movement mechanism.

33. The substrate processing apparatus according to claim 28, wherein,
along the arrangement direction, a center of the opening is aligned to a position closer to the one end than a center in a corresponding processing tank of the processing tanks.

34. The substrate processing apparatus according to claim 28, wherein
the processing tank is a cleaning module.

35. The substrate processing apparatus according to claim 28, wherein
the plurality of processing tanks includes a first processing tank and a second processing tank, a space being provided therebetween, so that a first airstream blown out from a first opening facing the first processing tank is guided to the first processing tank and the space, and a second airstream blown out from a second opening facing the second processing tank is guided to the second processing tank and the space.

36. The substrate processing apparatus according to claim 28, wherein
the farther each respective opening is from the fan filter unit, the larger said opening is formed to be.

* * * * *